United States Patent [19]
Weber et al.

[11] Patent Number: 6,113,643
[45] Date of Patent: *Sep. 5, 2000

[54] METHOD AND SYSTEM FOR VEHICLE DESIGN USING OCCUPANT VISION ZONES

[75] Inventors: William Francis Weber, Bloomfield Hills; Daniel Cornelius Bach, Belleville; Nicholas D. McGuire, Ypsilanti; Frederick Abraham Karam, Allen Park; Sean James Sevrence, Temperance; Scott Ming-Hua Tang; Michael Joseph Walraven, both of Ypsilanti; Mark Russell Henault, Milford, all of Mich.

[73] Assignee: Ford Global Technologies, Inc., Dearborn

[*] Notice: This patent is subject to a terminal disclaimer.

[21] Appl. No.: 08/984,768

[22] Filed: Dec. 4, 1997

(Under 37 CFR 1.47)

[51] Int. Cl.[7] ............................. G06F 17/50; G06F 9/455
[52] U.S. Cl. .................................. 703/8; 703/1; 345/419
[58] Field of Search ...................... 395/500.01, 500.37, 395/500.29; 345/333, 348, 353, 356, 419, 473, 339, 355; 364/148.01, 149, 150, 151, 152, 468.01, 468.02, 468.03, 468.04, 468.09, 468.1, 468.12; 180/271, 286, 287; 280/1; 434/29, 257, 267, 365, 370, 373; 382/104

[56] References Cited

U.S. PATENT DOCUMENTS

| | | | |
|---|---|---|---|
| 4,439,824 | 3/1984 | Mayer | 700/30 |
| 4,625,329 | 11/1986 | Ishikawa et al. | 382/104 |
| 4,811,240 | 3/1989 | Ballou et al. | 345/334 |
| 4,912,657 | 3/1990 | Saxton | 345/356 |

(List continued on next page.)

FOREIGN PATENT DOCUMENTS

| | | |
|---|---|---|
| 0 401 900 A1 | 5/1990 | European Pat. Off. . |
| 2 240 414 | 12/1990 | United Kingdom . |

OTHER PUBLICATIONS

R.W. McLay et al., "Ergonomics, spinal injury, and industrial vehicle safety", Proceedings of the 1996 Fifteenth Southern Biomedical Engineering Conference, 1996, pp. 191–194.

(List continued on next page.)

*Primary Examiner*—Eric W. Stamber
*Assistant Examiner*—Russell W. Frejd
*Attorney, Agent, or Firm*—David B. Kelley

[57] ABSTRACT

A computer based system and method for designing an automotive vehicle based on occupant vision orients an occupant representation, in electronic form, with respect to a three-dimensional electronic representation of a portion of the vehicle. At least one vehicle system is represented, also in electronic form, with respect to a common reference point, at least one human factors vision study is electronically performed to determine occupant vision with at least one vehicle system, and an outcome of that study is reported to a vehicle designer. The designer then has an option to vary, or alter, the occupant orientation, the location of the vehicle system, or both, so that the design meets a predetermined vision criteria of the study. However, the designer may opt to retain the design despite non-compliance with the vision criteria. If a parameter change is made, the system and method automatically rebuild every other effected dimension, and vehicle systems to satisfy the regenerated design are automatically selected from all electronic parts library so that packaging alternatives can be quickly studied. A geometric representation of occupant vision relative to a vehicle system may be displayed to allow a designer to visually assess compliance with a particular vision criteria. The occupant representation, vehicle, vehicle system, and geometric representation of the occupant vision may be rendered and animated in three-dimensions permitting views from various perspectives. The method and system can quickly provide accurate human factors vision studies for a vehicle design while allowing system packaging flexibility.

63 Claims, 25 Drawing Sheets

(15 of 25 Drawing Sheet(s) Filed in Color)

U.S. PATENT DOCUMENTS

| | | | |
|---|---|---|---|
| 5,033,014 | 7/1991 | Carver et al. | 703/1 |
| 5,070,534 | 12/1991 | Lascelles et al. | 345/348 |
| 5,111,413 | 5/1992 | Lazansky et al. | 703/16 |
| 5,189,626 | 2/1993 | Colburn | 700/182 |
| 5,197,120 | 3/1993 | Saxton et al. | 345/439 |
| 5,293,479 | 3/1994 | Quintero et al. | 345/353 |
| 5,481,465 | 1/1996 | Itoh | 700/118 |
| 5,590,268 | 12/1996 | Doi et al. | 345/326 |
| 5,729,463 | 3/1998 | Koenig et al. | 700/98 |
| 5,761,063 | 6/1998 | Jannette et al. | 700/97 |
| 5,799,293 | 8/1998 | Kaepp | 706/45 |
| 5,844,554 | 12/1998 | Geller et al. | 345/333 |

OTHER PUBLICATIONS

S. Aono, "The Next Step in Automotive Electronic Control", International Congress on Transportation Electronics, 1988, Convergence 88, pp. 83–89.

M. Asano et al., "New Approach in Automotive Control—An Experimental Variable–Response Vehicle", 1991 International Conference on Inductrial Electronics, Control and Instrumentation 1991, IECON 91, pp. 123–128.

P.A.J. Barham et al., "Ergonomic and Safety Implications of In–Car ATT DEvices—Evidence from Field Trials with Elderly Drivers", IEEE Colloquium on Design of the Driver Interface, 1995, pp. 4/1–4/3.

A. Pauzie et al., "Ergonomic Evaluation of A Prototype Guidance System in an Urban Area. Discussion about methodologies and data collection tools", Vehicle Navigation and Information Systems Conference, 1995, In Conjunction with the Pacific Rim TransTech Conference, 6th International VNIS, pp. 390–396.

J.L. Campbell, "Development of Human Factors Design Guidelines for Advanced Traveler Information Systems (ATIS)", Vehicle Navigation and Information Systems Conference, 1995, In Conjunction with the Pacific Rim TransTech Conference, 6th International VNIS, pp. 161–164.

J. Laird Evans et al., "In–Vehicle Man–Machine Interaction–the SOCRATES approach", Vehicle Navigation and Information Systems Conference 1994, pp. 473–477.

T.S. Abbott et al., "Functional Catagories for Human–Centered Flight Design", Digital Avionics Systems Conference, 1993, 12th DASC, AIAA/IEEE, pp. 66–74.

E.J. Hartzell et al., "Computational Human Factors in Human–Machine Engineering—The Army–NASA Aircrew/Aircraft Integration (A/sup Mar. 1) Program", Proceedings of the IEEE 1988 National Aerospace and Electronics Conference, 1988 NAECON 1988, pp. 819–822.

SAE J903c, Nov. 1973—"Passenger Car windshield Wiper Systems".

SAE J1052, May 1987—"Motor Vehicle Driver and Passenger Head Position".

SAE J100, Mar. 1988—"Passenger Car Glazing shade Bands".

SAE J287, Jun. 1988—"Driver Hand Control Reach".

SAE J1516, Mar. 1990—"Accommodation Tool Reference Point".

SAE J1517, Mar. 1990—"Driver Selected Seat Position".

SAE J1521, Mar. 1990—"Truck Driver Shin–Knee Position For Clutch and Accelerator".

SAE J1522, Mar. 1990—"Truck Driver Stomach Position".

SAE J826, Jun. 1992—"Devices for Use in Defining and Measuring Vehicle Seating Accommodation".

SAE J941, Jun. 1992—"Motor Vehicle Drivers' Eye Locations".

SAE J902, Apr. 1993—"Passenger Car Windshield Defrosting Systems".

SAE J198, Jun. 1993—"Windshield Wiper Systems—Truck, Buses, and Multipurpose Vehicles".

SAE J1100, Jun. 1993—"Motor Vehicle Dimensions".

SAE J1050, —Describing and Measuring the Driver's Field of View.

"Automating Design in Pro/Engineer with Pro/Program", Mark Henault, Sean Sevrence and Mike Walraven (Onword Press) 1997.

Chrysler Puts Comfort in the Front Seat with Ilog Tools (S. Alexander) Internet Web Site http://www.infoworld.com/pageone/special/eccase042296.htm (Internet publication date unknown).

Inspec acc. No. 2832913, Sammie: a computer aided tool for ergonomists, Proc. Human Factors Soc. $30^{th}$ meeting, vol. 1, pp. 695–698, Dayton Ohio, Sep. 29–Oct. 3, 1986.

Inspec acc. No. 4408183, Use of ergonomic workspace modeling in vehicle design, CAES '92, pp. 145–152, 1992.

TECHMATH releases RAMSIS 3.4 Human–Modeling Software, at www.nasatech.com/News/techmath_ 0119.html.

Inspec Acc. No. 1816358, Sammie: A Computer Aid for Man Machine Modelling, 8th Annual Conference on Computer Graphics and Interactive Techniques, Computer Graphics, Aug. 1981, vol. 15, No. 3, pp. 163–169.

F. Purschke et al., Virtual Reality—New Methods for Improving and Accelerating the Development Process in Vehicle Styling and Design, Computer Graphics International, 1998, pp. 789–797.

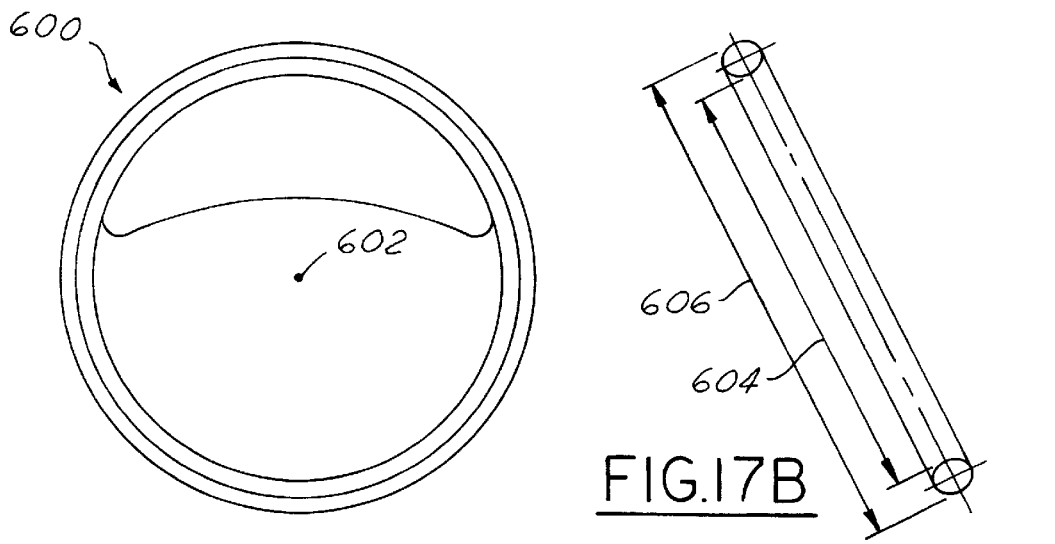
FIG.17A
FIG.17B
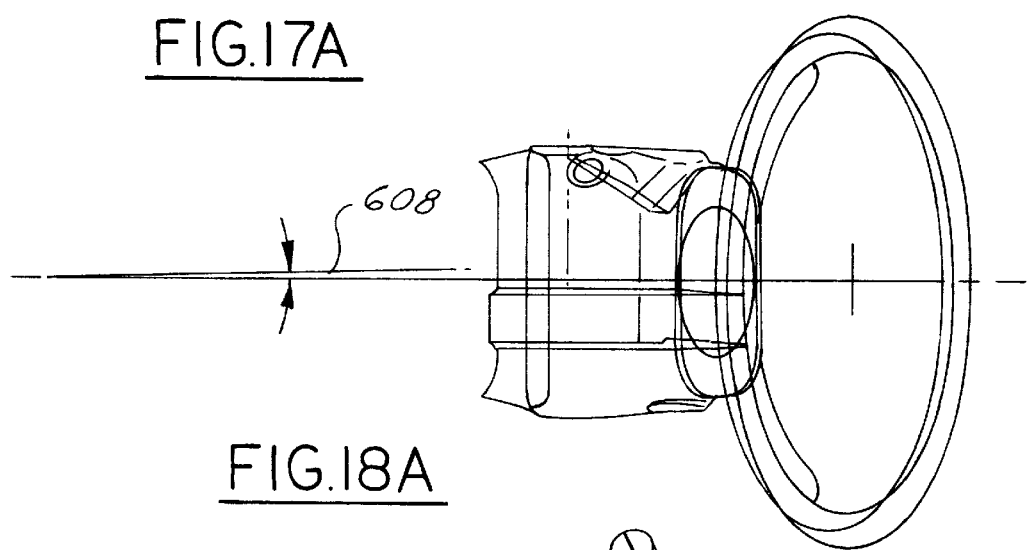
FIG.18A
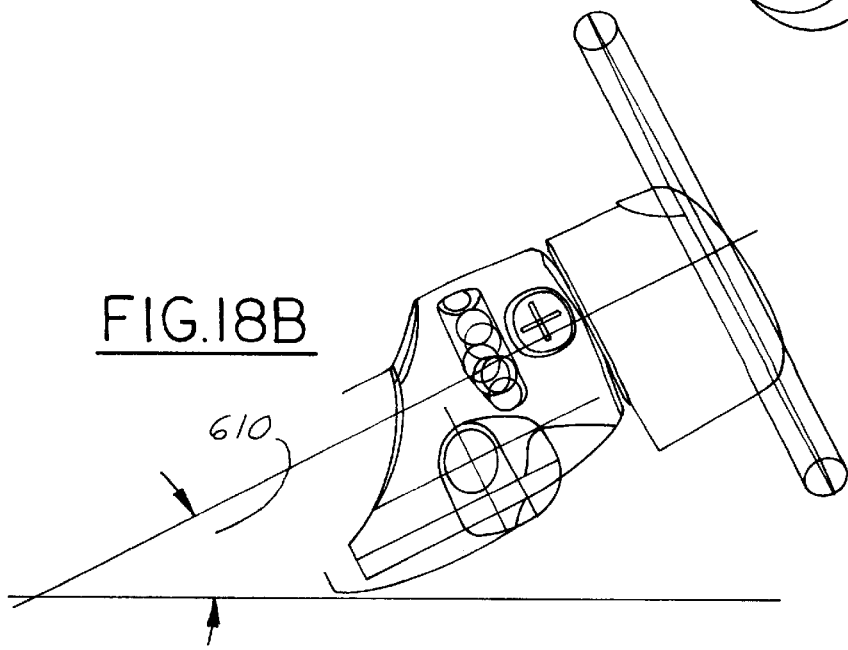
FIG.18B

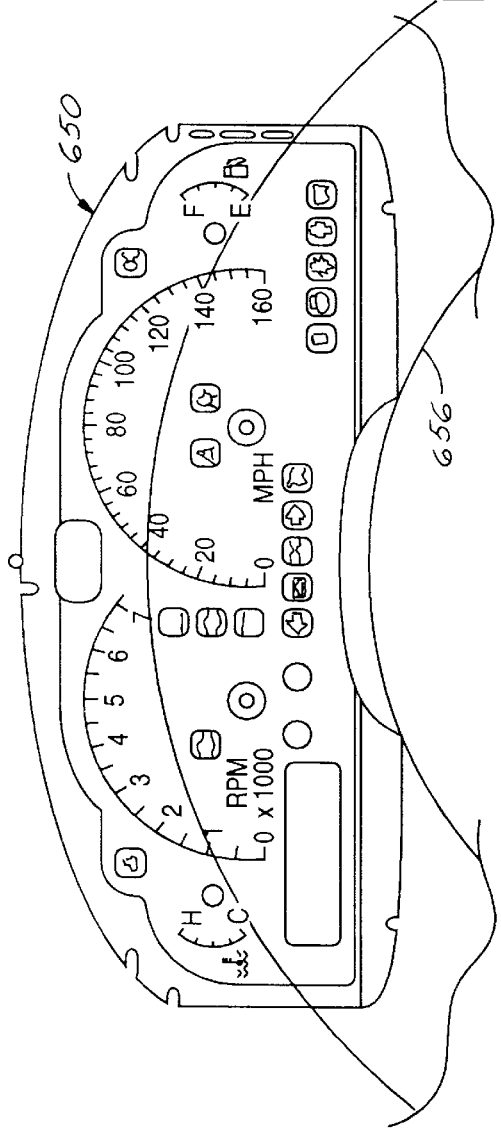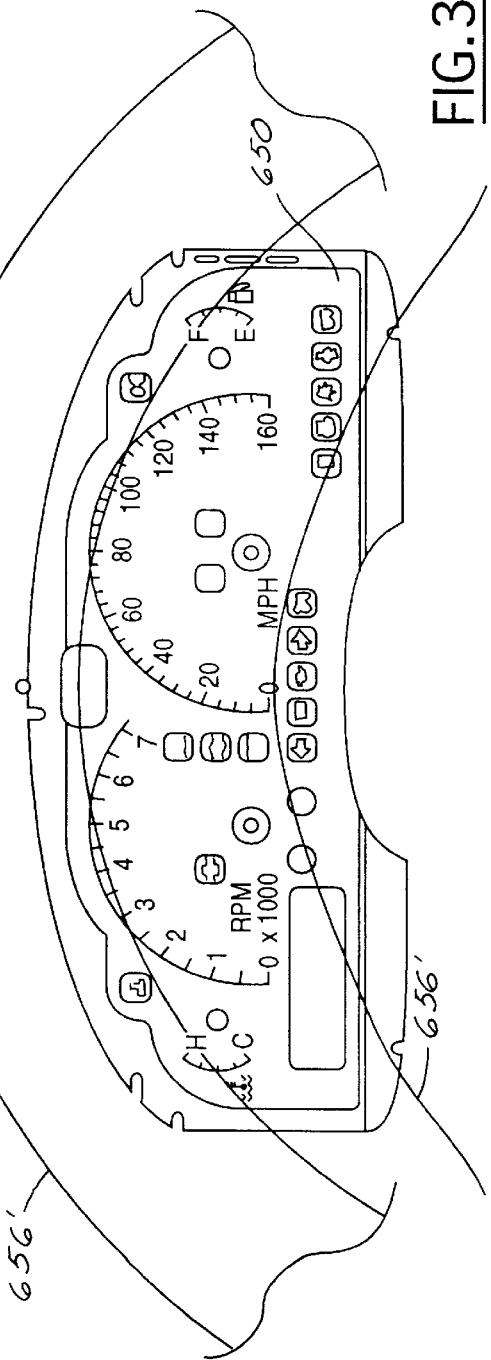

METHOD AND SYSTEM FOR VEHICLE DESIGN USING OCCUPANT VISION ZONES

FIELD OF THE INVENTION

The present invention relates to computer aided automotive vehicle design, in general, and more specifically to occupant vision based vehicle design.

BACKGROUND OF THE INVENTION

Vehicle design has advanced to a state in which occupant comfort and convenience, sometimes called ergonomics or human factors, is on at least an even par with the transportive aspects of a vehicle. This evolution has been driven by the availability of new technologies, including instrument panel clusters, adjustable steering wheels and columns, vehicle electronics, and movable seats, to mention only a few. With the addition of each new technology to the automotive vehicle environment, however, has come additional complexity in packaging the various occupant appurtenances to best achieve both design and ergonomic functionality.

One aspect of this packaging task is to provide an occupant, particularly a vehicle driver, with vehicle controls and instrumentation which can be readily seen while seated in the vehicle. That is, a vehicle design goal is to position vehicle systems, such as radio controls, lighting controls, seat belts, a manual gear shift, and the like, within a seated occupant's view without need for forward or backward adjustment. Current practice relies on various methods to determine whether a proposed design meets preferred vision requirements. Typically, a proposed design is analyzed in two-dimensions which requires many "cuts" of a drawing. A three-dimensional "buck" is also used to give a better overall view of the design, but such physical representations are expensive, time consuming, and difficult to modify for a subsequent design. Since there may be many individual components which affect occupant vision of controls and instrumentation, the tasks associated with capturing all of the required human vision factors packaging requirements are daunting. For example, a single rimblock study, which determines whether a steering wheel obstructs significant portions of an instrument panel viewable by a given occupant, can require several hours to complete. In total, performing human factors vision studies typically requires many weeks under current practice, assuming the availability of experienced analysts to conduct all of the individual studies.

An additional problem with current design practice is that it leaves room for errors, due to the complex instructions required to perform the studies. Current design practice also is inflexible in that a change in one component, even a minor component, requires all human factors vision studies to be redone, resulting in greater expense and delay of design completion.

SUMMARY OF THE INVENTION

The present invention overcomes the deficiencies of current vehicle design practice by providing a method and system which can quickly provide accurate human factors vision studies for a vehicle design while allowing system packaging flexibility. The computer based system and method of the present invention orients an occupant representation, in electronic form, with respect to a three-dimensional electronic representation of a portion of the vehicle. At least one vehicle system is represented, also in electronic form, with respect to a common reference point. At least one human factors vision study is performed to determine occupant vision with respect to at least one vehicle system, and an outcome of that study is reported to a vehicle designer. The designer then has an option to vary, or alter, the occupant orientation, the location of the vehicle system, or both, so that the design meets the vision criteria of the study. However, the designer may opt to retain the design despite non-compliance with the vision criteria. In addition, a geometric representation of occupant vision relative to a vehicle system may be displayed to allow a designer to visually assess compliance with a particular vision criteria. The occupant representation, vehicle, vehicle system, and geometric representation of the occupant vision may be rendered and animated in three-dimensions permitting views from various perspectives.

An advantage of the present invention is a method and system for vehicle design which considerably reduces vehicle design time and expense.

Another advantage of the present invention is a method and system for vehicle design which can be applied to any vehicle system, device, or component which interacts with a vehicle occupant.

Yet another advantage of the present invention is a method and system which can be applied to any vehicle system which an occupant must see.

Still another advantage of the present invention is a vehicle design method and system which allows study of vehicle packaging feasibility early in the design process.

Another advantage of the present invention is a vehicle method and system which supports computer aided engineering (CAE) analysis and rapid prototyping.

Another advantage is a method and system for vehicle design which provides informed design decision making which supports vehicle program timing, and which reduces late design changes.

Yet another advantage of the present invention is a vehicle design system and method which provides flexibility in vehicle design while not being constrained by timing requirements imposed in traditional prototype design development.

Still yet another advantage is a vehicle design system and method which provides generic, ergonomically sound parametric automated design of various portions of a vehicle.

A feature of the present invention is a vehicle design system and method which provides accelerated, three-dimensional solid modeling of automated vision studies in packaging of vehicle systems.

Another feature of the present invention is the ability of a vehicle designer to easily alter any factor with the result that the system and method automatically rebuild every other effected dimension so that packaging alternatives can be quickly studied.

BRIEF DESCRIPTION OF THE DRAWINGS

The file of this patent contains at least one drawing executed in color. Copies of this patent with color drawings will be provided by the Patent and Trademark Office upon request and payment of the necessary fee.

The objects, advantages, and features of the present invention will be apparent to those skilled in the art upon reading the following description with reference to the accompanying drawings, in which:

FIGS. 17A and 17B show a plan view and a cross-sectional view, respectively, of steering wheel dimensions for use in the human factors vision study;

FIGS. 18A and 18B show top and side views, respectively, of steering wheel orientation angles;

FIG. 30 is a forward view of an instrument panel graphics plane with a steering wheel rimblock zone projected thereon showing significant instrumentation blockage;

FIG. 32 is a forward view of an instrument panel graphics plane with a steering wheel rimblock zone projected thereon similar to FIG. 31 but showing a a clear view of significant portions of the instrument panel;

DETAILED DESCRIPTION OF THE PREFERRED EMBODIMENT

Figure 1:
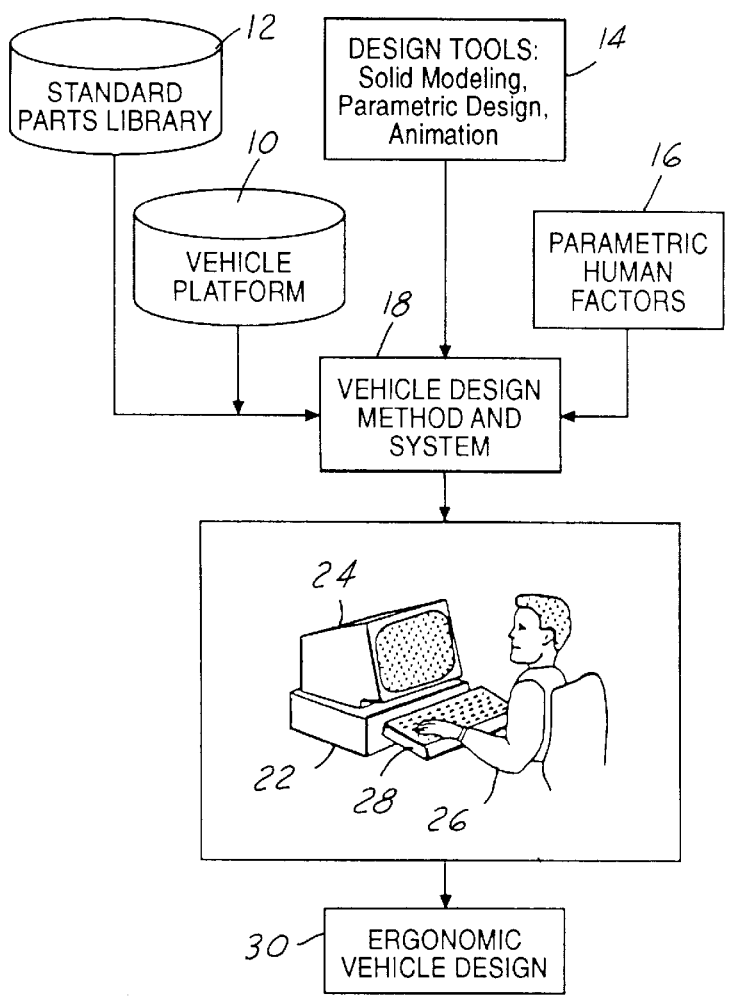
FIG. 1 is a flow chart illustrating various parts of a system for designing an automotive vehicle according to the present invention.

Automotive vehicle design, and in particular design with respect to occupant vision of a portion of an automobile, is achieved according to the present invention with a generic, parametric driven design process. This process allows flexibility in vehicle design, including performance of numerous ergonomic vision studies in a small fraction of the time required with conventional vehicle design. The present invention enables an acceptable design to be achieved in minutes, as opposed to days and weeks previously required. Various computer based tools are integrated to achieve this enormous time and expense savings, including solid modeling, parametric design, automated studies, and a non-parametric component library, sometimes called a standard parts library. Referring to FIG. 1, the tools used by the method and system of the present invention are shown graphically. Vehicle platforms are electronically represented on an electronic storage device 10, which includes representation of vehicle sheet metal, for example. A standard parts library 12, also stored on an electronic medium, has electronic representations of production parts, generic parts, and others. Packaging studies with these l)arts can be done to assess many factors, including the potential for reuse and complexity reduction #14. Solid modeling takes electronically stored vehicle platform data and standard parts data and builds complex geometry providing part-to-part or full assembly interference checking. Several commercial solid modeling programs ire available and generally known to those skilled in the art, such as Pro/Engineer® and IDEAS®. Solid modeling also allows three-dimensional visualization through use of rendering and animation systems, such as Vislab®, while being compatible with other computer aided engineering and rapid prototyping computer applications.

Parametric design is used in the electronic construction of vehicle geometry within a computer for ergonomic vision studies of components and assemblies. As certain dimensions, or parameters, are modified, the computer is instructed to regenerate a new vehicle or part geometry. The parametric human factor vision studies, generally shown at box 16, control and limit the design process in accordance with ergonomically desirable parameters, as is further discussed below.

Still referring to FIG. 1, the computer implemented method and system of the present invention, shown at box 18, advantageously combines all of the foregoing to provide an efficient, flexible, rapid design for a vehicle, or a portion of a vehicle, which meets predefined ergonomic vision requirements. As seen in FIG. 1, the present invention is implemented on a computer system 22, including a processor and a memory, which can provide display and animation of vehicle, occupant, and vehicle part electronic representations on a display such as a video terminal 24. Parameter selection and control for the design method can be accomplished by a user 26 via a keyboard 28, or other user interaction device, such as a mouse. One input method could include a pop-up window with all current parameters, including an on-line description for the parameter and a current value therefor. Other input methods will occur to those skilled in the art. For example, parametric values may be picked from a table within a two-dimensional mode since some vehicle designers prefer to view an assembly in sections which can be laid out on a drawing.

Figure 2:
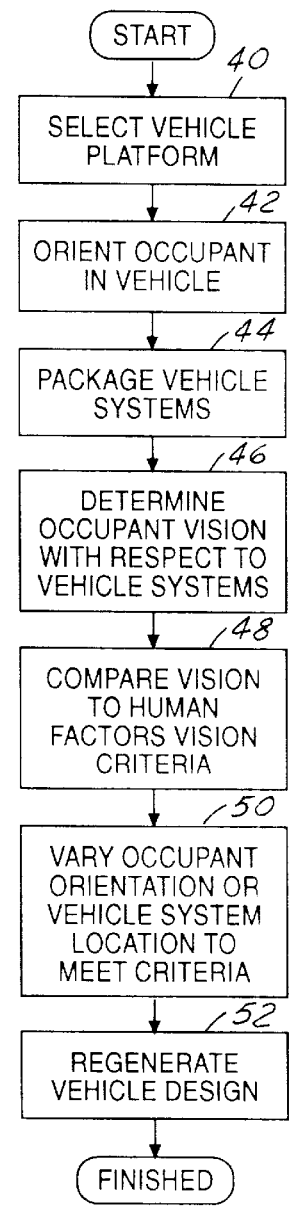
FIG. 2 is a flow chart of one embodiment of a method for designing a vehicle according to the present invention.

Turning to FIG. 2, a flowchart of a method according to the present invention is shown. In box 40 of FIG. 2, a vehicle platform is selected so that an electronic representation of vehicle sheet metal, including a floor plan, is available. It should be understood that use of the term vehicle in this disclosure implies an electronic representation of at least a portion of at least a portion of a vehicle, for example the floor pan sheet metal. It should also be understood that vehicle platform selection is optional, and that occupant orientation and vehicle system packaging, as next described, need only be situated with respect to a common referenced point. Vehicle system selection is primarily for visual design and is not necessary for the present invention.

Figure 3:
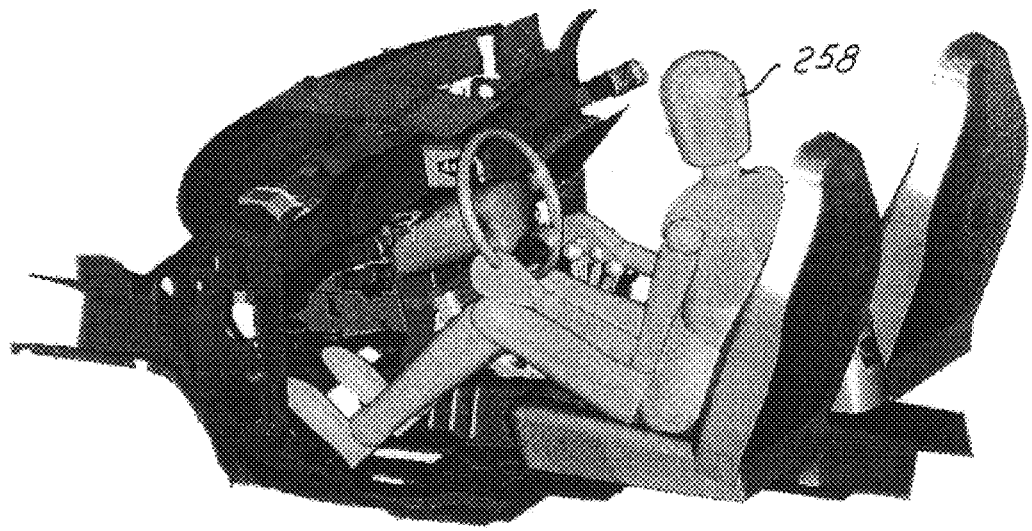
FIG. 3 is a color perspective view of a portion of an automotive vehicle having an occupant representation situated thereon representing a 95% male.
Figure 4:
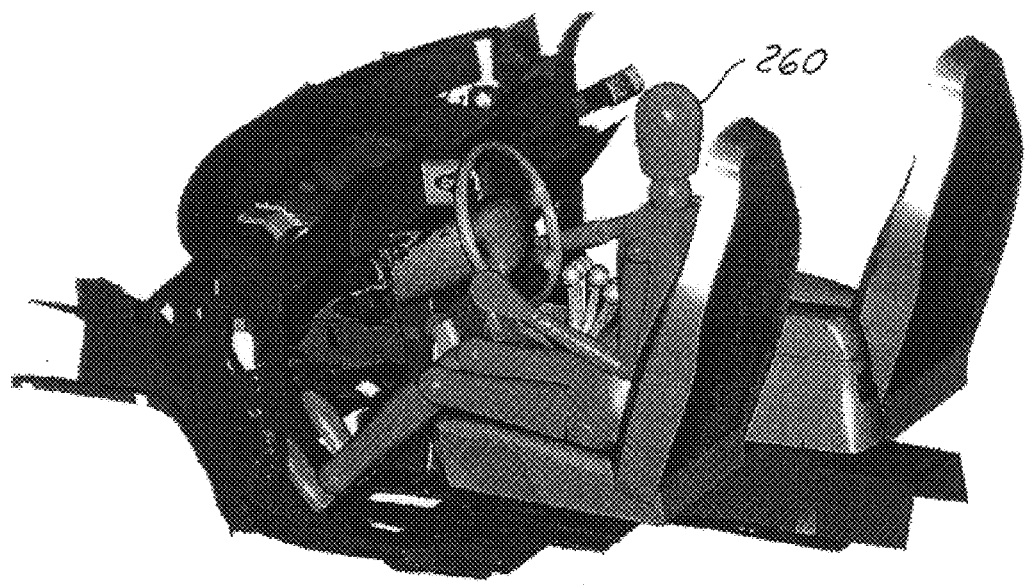
FIG. 4 is a color perspective view of a portion of an automotive vehicle having an occupant representation situated thereon representing a 5% female.

In box 42 of FIG. 2, an occupant representation is oriented in the vehicle. For purposes of this disclosure, orientation of an occupant means specifying or selecting values for a set of occupant position parameters which represent various occupant locations with respect to the vehicle. These occupant position parameters may include data for the three-dimensional location of an occupant hip point, a distance between an accelerator heel point and the occupant hip point, and occupant back angle. Selection of an occupant type, for example, may also be important so that occupant attributes, such as arm length and head height, are known. Various occupant types may be selected, including that for a 95% male 258 (FIG. 3) and the 5% female 260 (FIG. 4). Representation of an occupant in the form of a mannequin, as is done in many of the drawings herein disclosed, including FIGS. 3 and 4, is for user convenience only and is not necessary for operation of the method and system of the present invention. Rather, selection of certain occupant orientation parameters is all that is required. Those skilled in the art will recognize that other occupant position parameters may also be used, and that only one, or a combination of parameters, may be required to orient an occupant representation within the vehicle. Selection will depend on the particular human factors study to be performed.

After the occupant has been oriented as described above, various systems, devices, or components are then packaged on the vehicle. For purposes of this disclosure, packaged means that an electronic representation of the dimensions of the system, device, or component are geometrically related to the vehicle three-dimensional electronic reference frame, coordinate system, or reference point. These systems may include, but are not limited to, instrument panel clusters, electronic clusters, including radios, tape players, and CD's, heating, ventilation, and air conditioning (HVAC) control panels and outlet ducts, door trim, glove box, air bags, knee bolsters, a steering wheel and column, a center console, a manual shift device, a rear view mirror, and seats. Vehicle systems is intended to include any part of the vehicle which will interact with an occupant, either directly or indirectly. Those skilled in the art will recognize that the foregoing list is intended to be illustrative only and not exhaustive. It should also be understood that occupant orientation (box 42) and packaging of vehicle systems (box 44) need not be accomplished in the order indicated in FIG. 2, but can be done in reverse order, or intermingled, that is, various systems may be packaged, the occupant oriented within the vehicle, and other systems subsequently packaged.

After the occupant is oriented and the vehicle systems are initially packaged as described above, occupant vision with respect to various vehicle systems is then determined. Occupant vision may be determined in many ways, for example generating vision geometries, including distances, surfaces, and zones. The vision geometries may represent, but are not limited to, a rimblock surface, an internal downlook surface, external forward and rearward downlook surfaces, a maximum trim cover opening blockage zone, a maximum mask opening blockage zone, and A, B, and C vision zones. The aforementioned occupant vision geometries are determined with the design tools described above, including solid modeling, parametric design and animation. Those skilled in the art will understand that other design tools may also be used to determine various occupant vision interaction with the vehicle systems.

Three dimensional geometric vision interaction, or lack of vision interaction, between an occupant and vehicle systems may be generated (box 46, FIG. 2). These interactions may then be communicated to the user, such as by reporting or displaying. Animation on a video screen in three-dimensions with different colors representing various vehicle systems, occupant interactions, and occupant vision representations can be used to effectively communicate study results. However, a printed report of the occupant vision interaction, such as whether occupant vision is obstructed by a vehicle system, may be sufficient.

Still referring to FIG. 2, when occupant vision interactions have been determined, they may be compared to a set of human factors vision criteria, as shown in box 48. The human factors criteria comprise a set of data or information which specifies a preferred occupant vision interaction. Such vision criteria may include, for example, the requirement that all vehicle systems on an instrument panel center stack be within a 35° downlook zone without occupant head movement. Numerous other human factors vision criteria can be used in the comparison of box 48. The comparison may be done visually, such as viewing an occupant vision interaction from various perspectives of the vehicle, occupant, and vehicle systems. For example, vision surfaces may be displayed to show whether an occupant is able to see buttons on a radio positioned on the instrument panel. The surfaces so displayed form vision zones such that vehicle system controls, such as buttons which are occupant viewable, appear in a vision zone above the vision surface, while those controls which are not viewable appear in a non-vision zone below the vision surface.

If an occupant vision interaction does not meet a corresponding human factors vision criteria, adjustment to the vehicle design can be made by varying the occupant orientation, the vehicle systems locations, or both, or any generic parameter, as shown in box 50 (FIG. 2). Adjustment of the various parameters may be non-iteratively performed, that is, a vehicle designer may change one or more of the parameters based on past design experience in a single step, or steps. Alternatively, the steps of FIG. 2 may be iteratively performed until an acceptable design is achieved or a conclusion is made that such a design is not possible. Variation of the parameters may be conducted interactively through user 26 input (FIG. 1). It should be understood that variation of the occupant orientation or the vehicle systems is optional and that the human factors vision criteria may or may not be required to be met.

When a change is made to the occupant orientation, a vehicle system, or any design parameter, for example a locational change with respect to the chosen coordinate system, regeneration of the entire vehicle design is electronically performed (box 52 of FIG. 2). During this regeneration step, appropriate relationships between the occupant representation, the vehicle systems, and the vehicle are automatically determined, and vehicle systems are automatically changed according to the revised parameters. That is, the method and system of the present invention will automatically rebuild every other affected dimension so that packaging alternatives can be quickly studied. In the regeneration step, originally selected vehicle systems or devices may need replacement to fit with the new design. This replacement is automatically done by selection of vehicle systems or devices from the electronic parts library to meet the vehicle system change, for example a locational change. It should therefore be understood that some changes to a vehicle design are selected by a vehicle designer, as discussed above and further discussed below with respect to FIG. 13, while other changes are accomplished automatically by the system and method of the present invention to accommodate designer specific changes. This feature allows packaging alternatives to be quickly studied.

Figure 5:
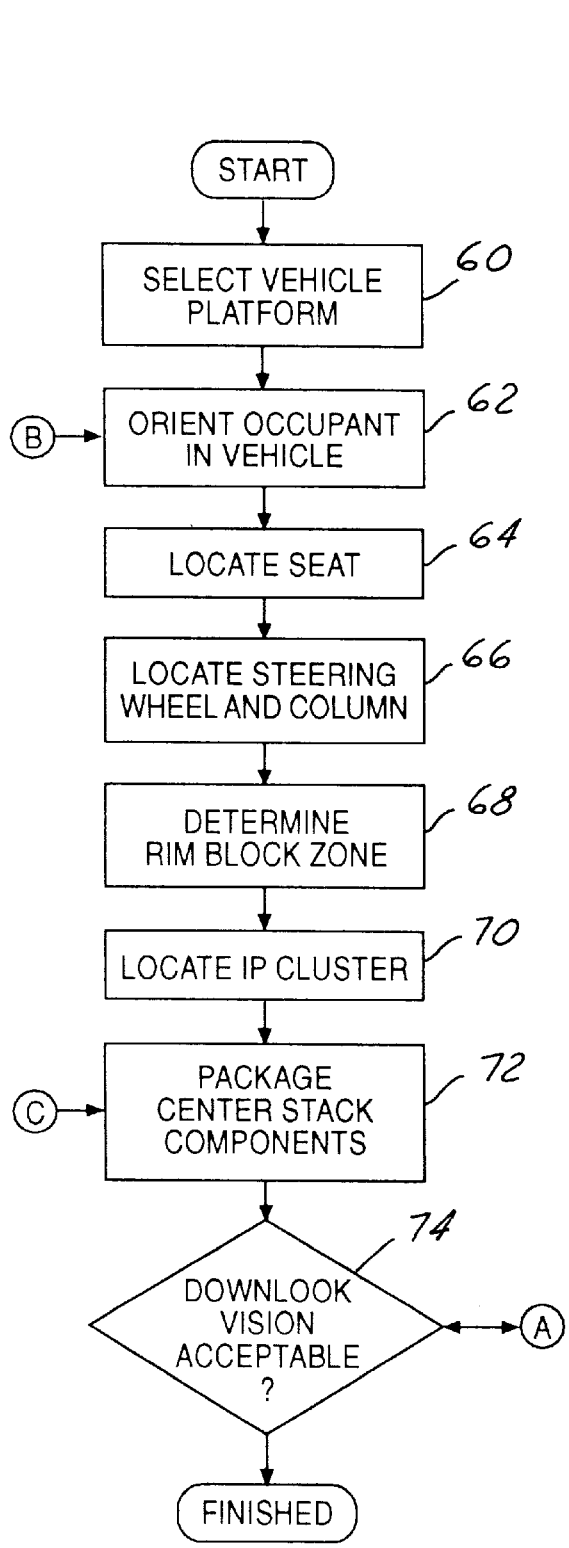
FIG. 5 is a flow chart of one detailed embodiment of a method for designing a vehicle according to the present invention.
Figure 6:
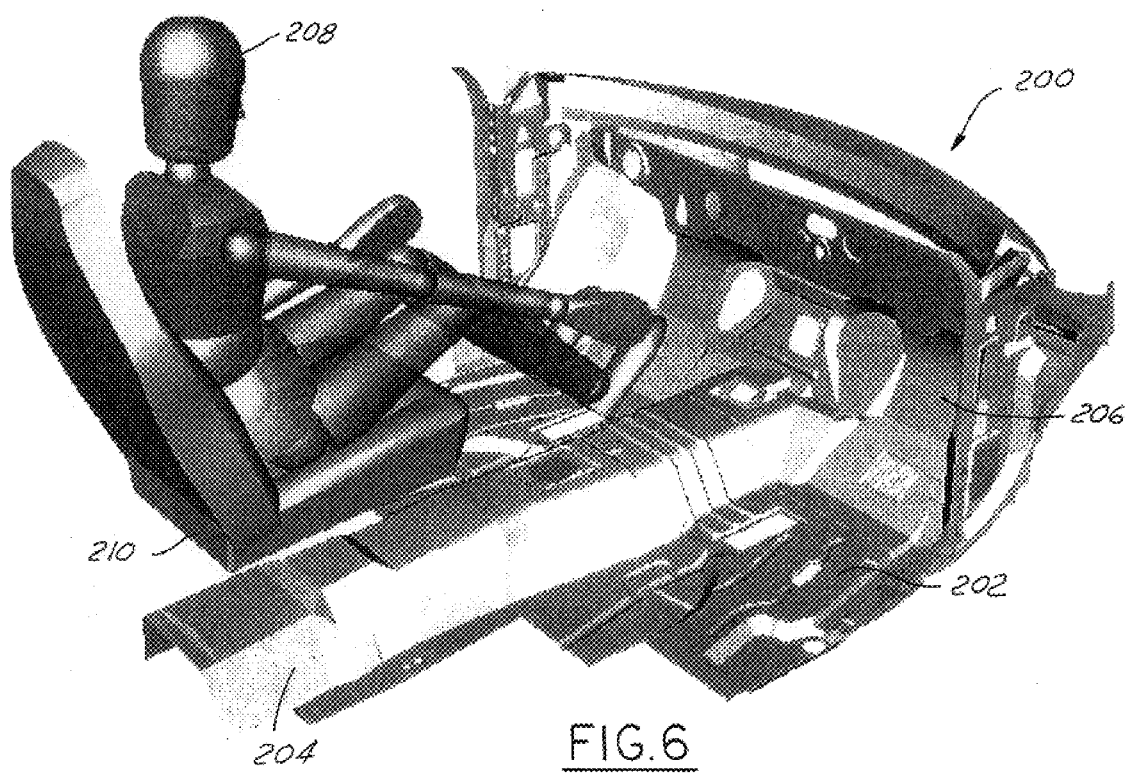
FIG. 6 is a color perspective view of a portion of an automotive vehicle showing an occupant representation oriented on a seat therein.

Turning now to FIG. 5, a detailed example of one embodiment of the method of the present invention is shown beginning at box 60. As seen in FIG. 6, a vehicle platform 200, shown in light gray, is selected to generate a three-dimensional, electronic representation of a floor pan 202, a transmission tunnel 204, and a front wall 206 (all shown in light gray). It should be understood that selection and display of the vehicle platform 200 shown in FIG. 6 is optional and not required for the method of the present invention. Selection of a vehicle platform may be from a list of vehicle platforms and will determine the three-dimensional coordinates of the platform in an electronic form as represented in the memory of the computer 22 (FIG. 1).

After selection of the vehicle platform, an occupant representation 208, shown in yellow in FIG. 6, is orientated in the vehicle as depicted in box 62 of FIG. 5. Orientation of the occupant representation 208 is accomplished as described above. This orientation includes selection of an occupant type which determines an occupant eyellipse location, further discussed below, and thus an occupant vision. For example, selection of a 5% female will orient occupant eyellipses at a predetermined position. Other relevant occupant orientation parameters can also be determined, for example an occupant back angle. These parameters are related to the vehicle reference frame, or to a common reference point, through the various occupant orientation parameters, for example, the occupant hip point.

In box 64 (FIG. 5), a seat 210 (orange, FIG. 6) is next located with respect to the vehicle platform 200 and the occupant representation 208, and the location of the seat 210 with respect to the occupant 208 will in part determine the type of seat which may be used in construction of the vehicle.

Figure 7:
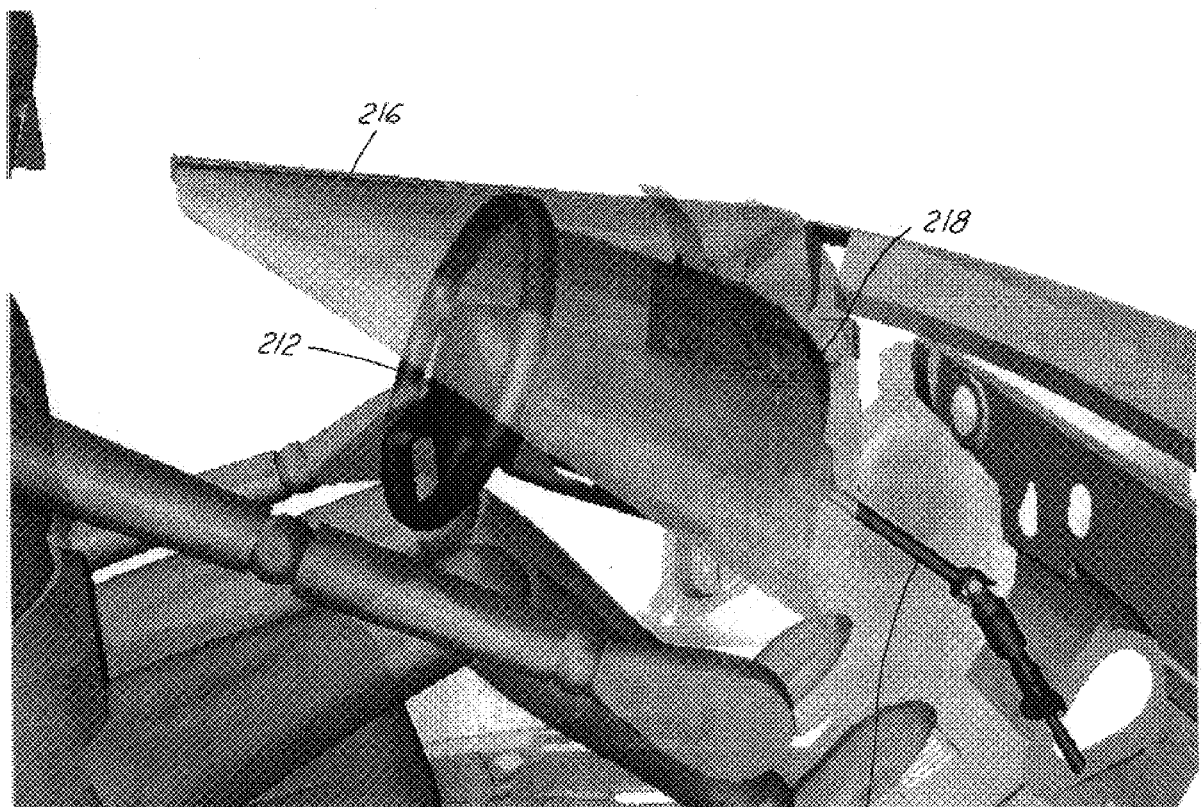
FIG. 7 is a color perspective view showing packaging of a steering wheel, steering column, and instrument cluster according to the present invention.
Figure 8:
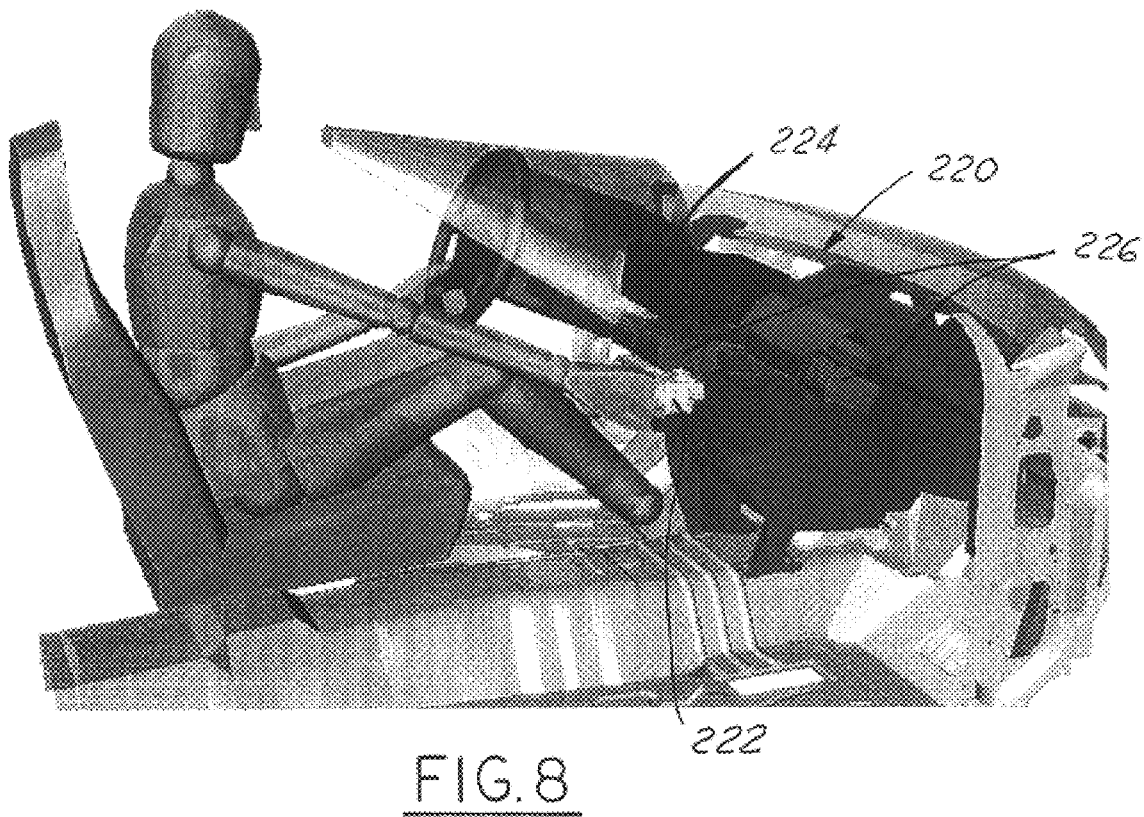
FIG. 8 is a color perspective view showing packaging of various instrument panel components according to the present invention.
Figure 9:
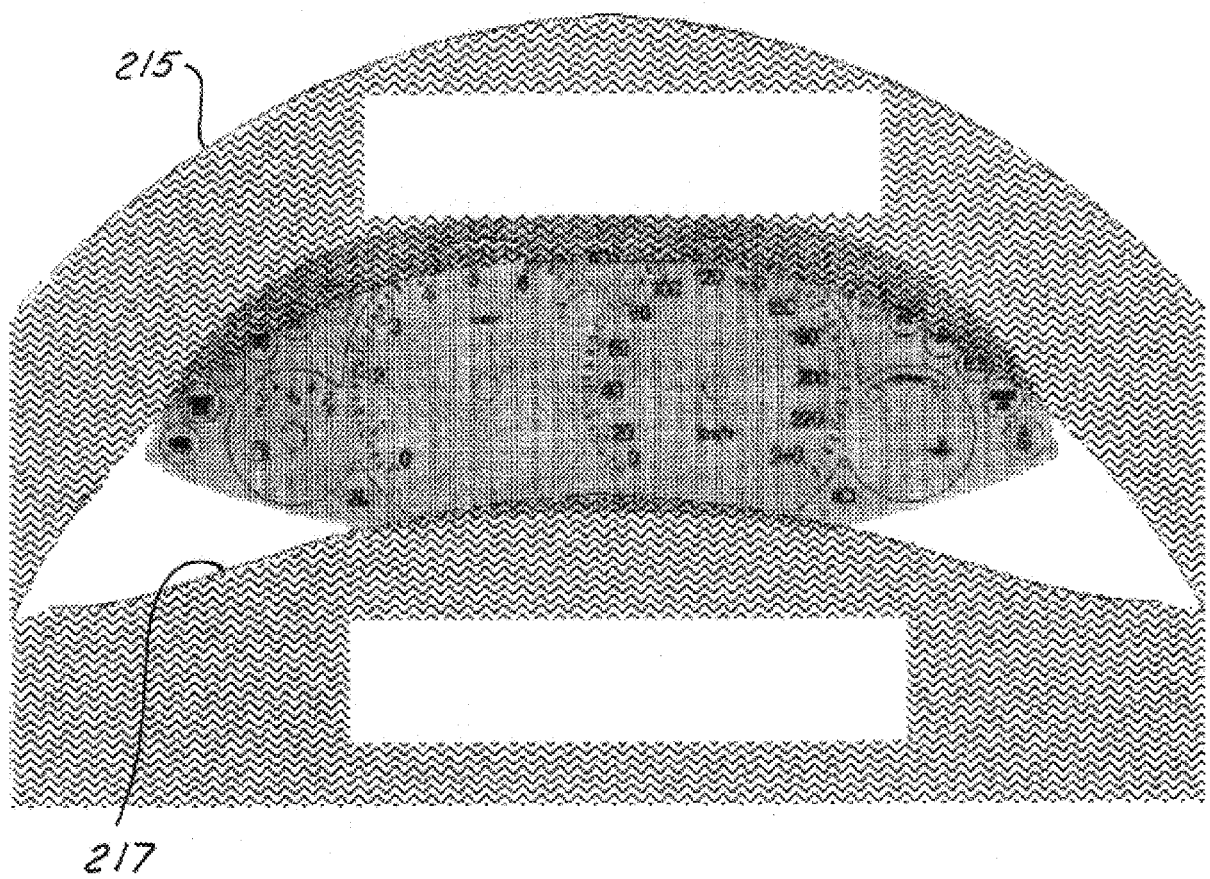
FIG. 9 is a color view from a driver perspective showing vision blockage due to the steering wheel and steering wheel hub.

After the seat 210 has been located, a steering wheel 212 and steering column 214 (shown in green FIG. 7) can be located (box 66 of FIG. 5). As with all of the systems packaged by the method of the present invention, the steering wheel and column may be selected from a list of electronic representations of those parts. The steering wheel and column are located such that the occupant in the driver's seat is able to access and easily use the steering wheel 212. An instrument panel cluster is next packaged, preferably by performing a rimblock study (box 68, FIG. 5) which determines, electronically, a zone which is obstructed from the driver's view in the forward direction by the steering wheel and steering wheel hub. This zone is referred to as a rimblock zone 216 (shown as yellow and green in FIGS. 7 and 8) and is used for proper placement of an instrument panel cluster (box 70, FIG. 5) containing gauges and other vehicle performance indicating devices. The IP cluster 218 (purple, FIGS. 7 and 8) is preferably placed out of the rimblock zone 216. A rim blockage zone 215 and a hub blockage zone 217, due to the steering wheel and the steering wheel hub for a given occupant, is shown in pink in FIG. 9. The IP cluster 218 is positioned so that important portions of the gauges and indicating devices do not fall into the rimblock area. The rimblock study is discussed in further detail be low.

The center stack components are next packaged (box 72 of FIG. 5). The center stack, generally indicated at 220 (FIG. 8), is that portion of the instrument panel in the center of the vehicle typically containing a panel, or panels, having instrument controls for vehicle audio electronics 222 (light yellow), HVAC controls 224 (black), and the like. The center stack may also contain HVAC outlets 226 (pink). It should also be understood that other HVAC outlets and instrument panel controls may be packaged during this step of the method of the present invention, for example, lighting controls for both the exterior and interior may be located outboard of the steering column on the instrument panel. Packaging of these components for purposes of this disclosure means selecting a device, component, or system and electronically representing such in a location proximate other vehicle structure so as not to interfere with adjacent components or structure. If interference is detected during packaging, an appropriate indication is given to the user.

Figure 10:
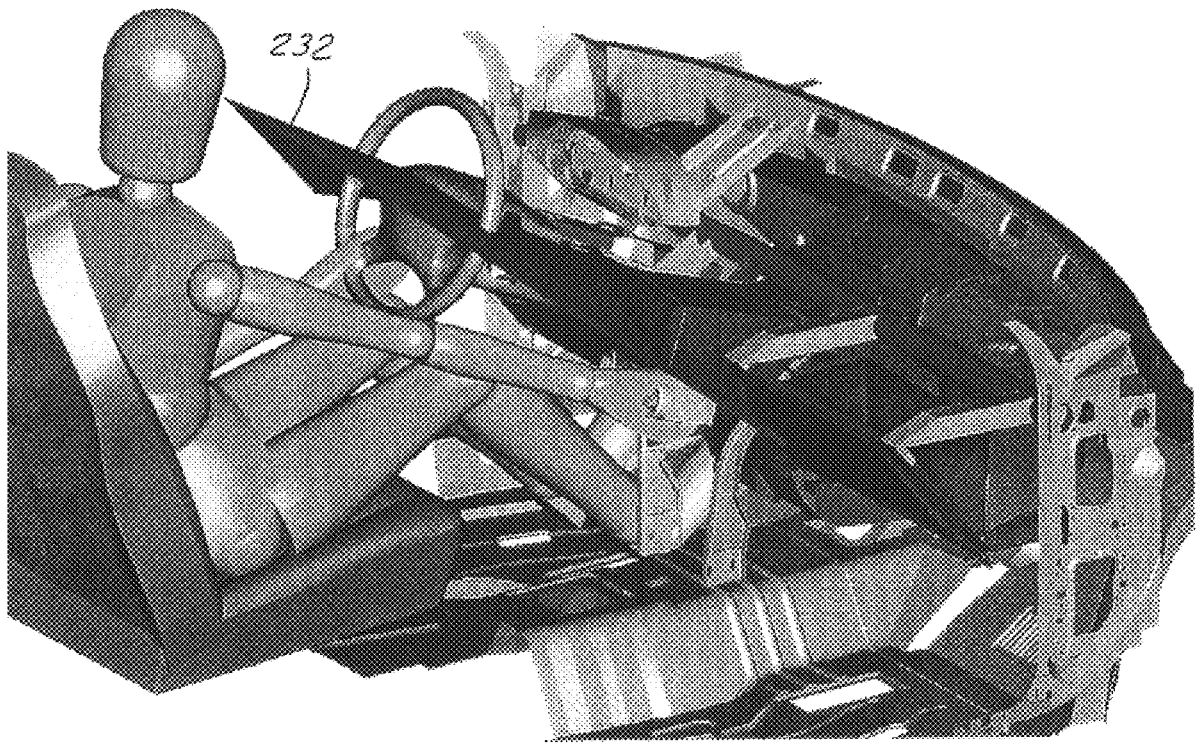
FIG. 10 is a color perspective view showing a downlook vision zone.
Figure 11:
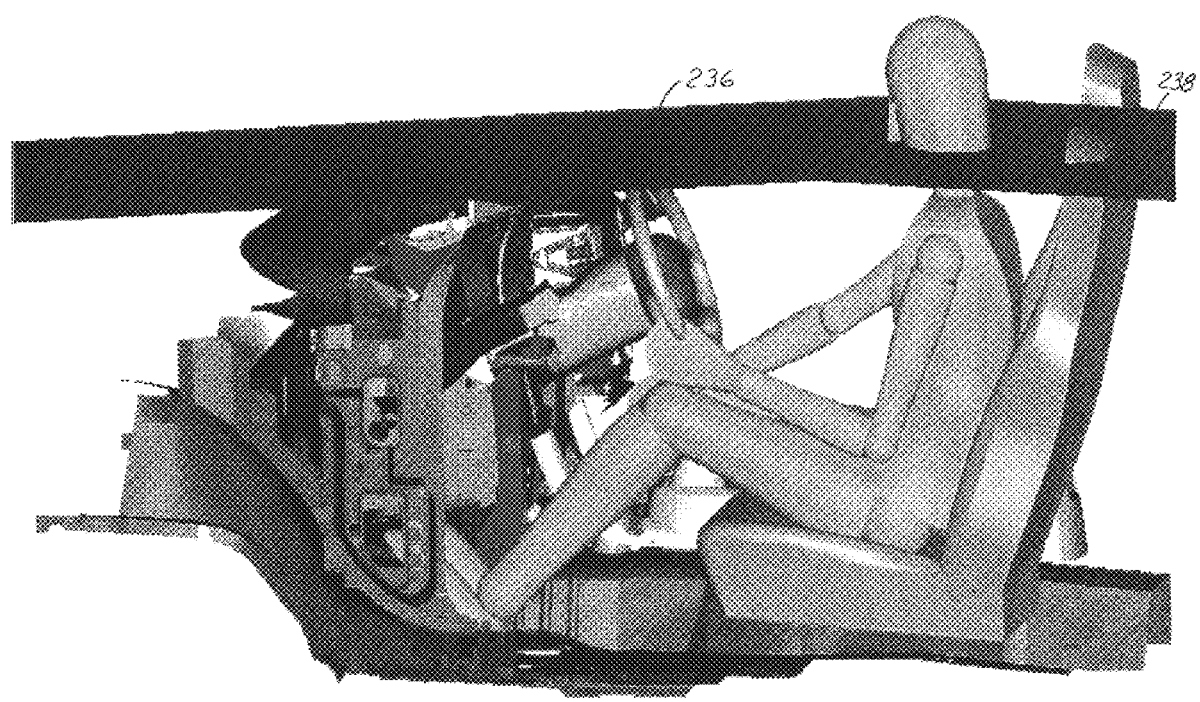
FIG. 11 is a color perspective view showing external forward and rearward downlook vision zones.
Figure 12A:
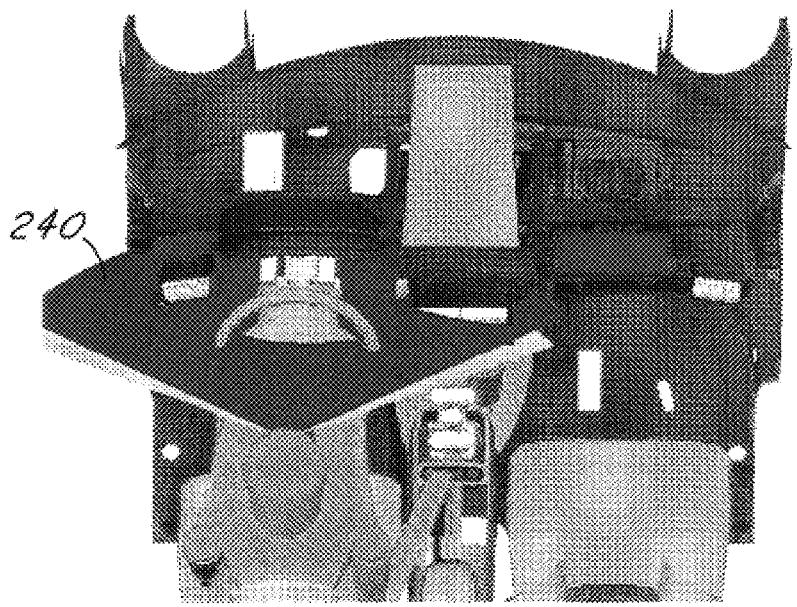
FIG. 12A is a color perspective view of a first downlook vision zone from an elevated rear view showing controls a driver car see without head movement.
Figure 12B:
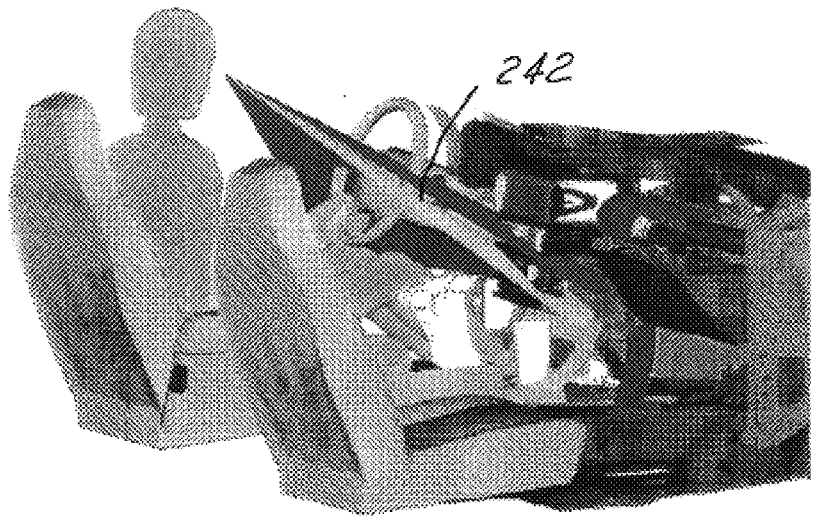
FIG. 12B is a color perspective view of a second downlook vision zone showing controls a driver can see with slight head movement.
Figure 12C:
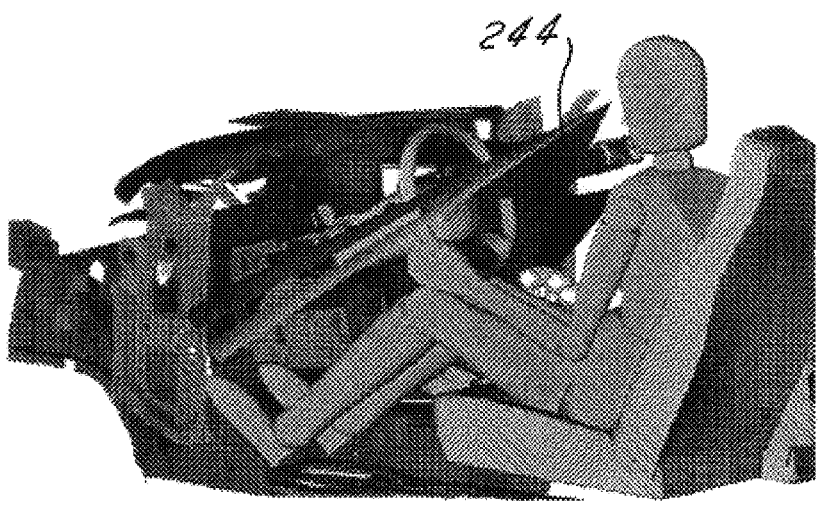
FIG. 12C is a color perspective view of a downlook vision zone showing controls a driver cannot see without significant head movement.

After the instrument panel components, devices, and systems have been packaged, various studies may be electronically performed to determine whether the package is satisfactory from a human factors criteria standpoint. Such studies may include, for example, an internal downlook zone created by an internal downlook surface 232 (blue in FIG. 10), and an external forward and rearward downlook zone created by an external forward downlook surface 236 and an external rearward downlook surface 238 (both green-blue in FIG. 11). Variations of these zones may also be made. For example, in FIG. 12A a first downlook surface 240 (green) defines a zone above which a driver can see all controls without any head movement. In FIG. 12B, a second downlook surface 242 (yellow) defines a zone above which a driver can see all controls with slight head movement. And in FIG. 12C, a third downlook zone 244 (red) defines a surface below which a driver cannot see any controls without significant head movement. The above described surfaces may be created as further described below.

Figure 13:
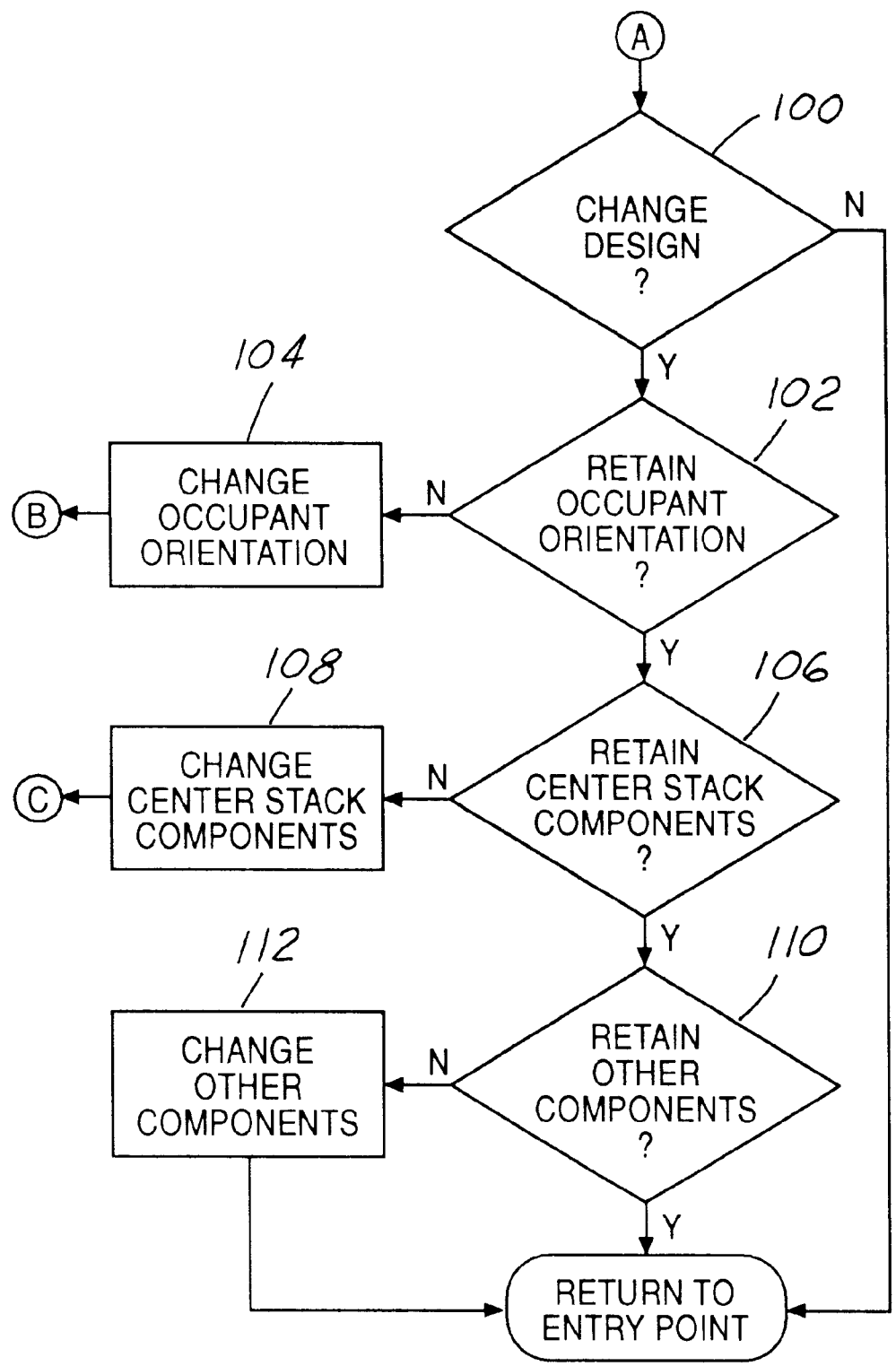
FIG. 13 is a flow chart showing a design change process used with the vehicle design method according to the present invention.

At box 74 in FIG. 5, a downlook study is performed, similar to that discussed above. Other studies may also be performed. Should the packaging be unacceptable from a human factor perspective, vehicle design alteration may be made. A design alteration determination flow chart, as shown in FIG. 13, can be used to perform changes to vehicle design, if any. In the first decisional diamond 100 of FIG. 13, the desire for design change is questioned. If the decision is made not to change vehicle design despite it not meeting designated human factor criteria, the flow is returned to the entry point from the flow chart in FIG. 5. Such a decision may be made, for example, when non-ergonomic considerations outweigh the desirability of design change for ergonomic reasons.

Continuing with FIG. 13, should there be a desire to investigate changing the vehicle design, retention of the current occupant orientation is made in the second decisional diamond 102. If it is determined not to retain the current occupant orientation, then a change is made thereto in box 104, and the flow is returned to entry point B in the flow chart of FIG. 5. For example, with reference to FIGS. 38 and 39, since the radio 222 is below the downlook surface and thus not viewable by the occupant 208 without head movement, a designer may decide to reorient the occupant to a lower position in the vehicle, that is vertically lower. When reorientation of the occupant is done, a new downlook surface 238' is generated (FIGS. 40 and 41), after performing the intermediate steps subsequent to entry point B in FIG. 5. It can be seen from FIG. 41 that the radio 222 is now partially above the surface 238' indicating that the radio controls are within the occupant view zone 239 and thus viewable by an occupant without head movement.

Figure 14:
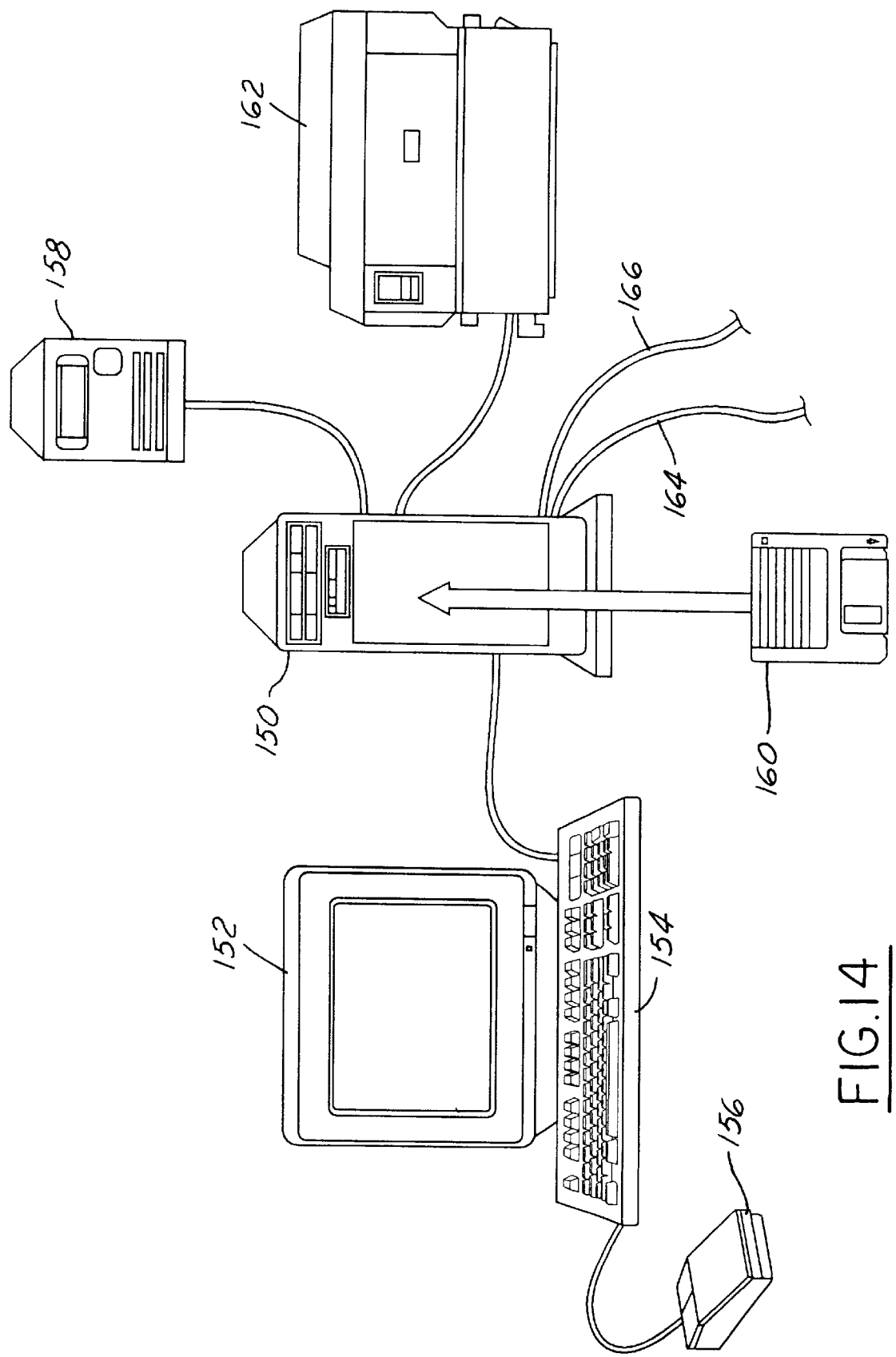
FIG. 14 is a view of a system for designing a portion of an automotive vehicle according to the present invention.

If it is determined to retain the current occupant orientation, the flow in FIG. 13 moves to the third decisional diamond 106 where it is determined whether to retain the current packaging configuration of the center stack components. If it is determined not to retain these current center stack components, the change is made in box 108 and the flow is returned to entry point C in the low chart of FIG. 5. It should be noted that, in the examples of FIGS. 38–41, a change to the packaging arrangement of the radio 222, alone or in conjunction with a change to the occupant orientation, may be made to meet the downlook criteria. However, if it is determined to retain the current packaging of the center stack components, the flow in FIG. 13 goes to the fourth decisional diamond 110 wherein it is determined to retain other vehicles components. If it is determined not to retain other vehicle components, then those components, or a subset thereof, are changed in box 112 and the flow returns to the entry point in the flow chart of FIG. 5, that is, the point in FIG. 5 which routed decisional flow to FIG. 13. However, if it is determined to retain the other vehicle components, then flow is returned to entry point A in the flow chart of FIG. 5 without any changes having been made to the vehicle design. It should be understood that the just described vehicle design change flow chart of FIG. 14 is optional and that the method and system of the current invention need not err ploy such a design change method or means for accomplishing such. It should further be noted that there are numerous possibilities for design change flow chart logic, and that FIG. 13 is meant to be illustrative and not limiting.

A representative system for occupant based vehicle design according to the present invention is depicted in FIG. 13. The system includes a processing unit 150 connected to a user interface which may include a display terminal 152, a keyboard 154, a pointing device, such as a mouse, 156, and the like. The processing unit 150 preferably includes a central processing unit, a memory, and stored instructions which implement a method for vehicle design according to the present invention. The stored instructions may be stored within the processing unit 150 in the memory, or in any non-volatile storage such as magnetic or optical media, EPROM, EEPROM, or the like. Alternatively, instructions may be loaded from removal magnetic media 160, such as a removal disk, sometimes called a floppy disk, optical media 158, or the like. In a preferred embodiment, the system includes a general purpose computer program to implement the functions illustrated and described herein. Of course, a system according to the present invention could also be embodied with a dedicated device which includes various combinations of hardware and software. The preferred embodiment may also include a printer 162 connected to the processing unit 150, as well as a server and a connection to an intranet 164 or the Internet 166. Preferably, solid modeling software, parametric design software, surface rendering software, animation software, and the like are used for developing a system according to the present invention.

Figure 15:
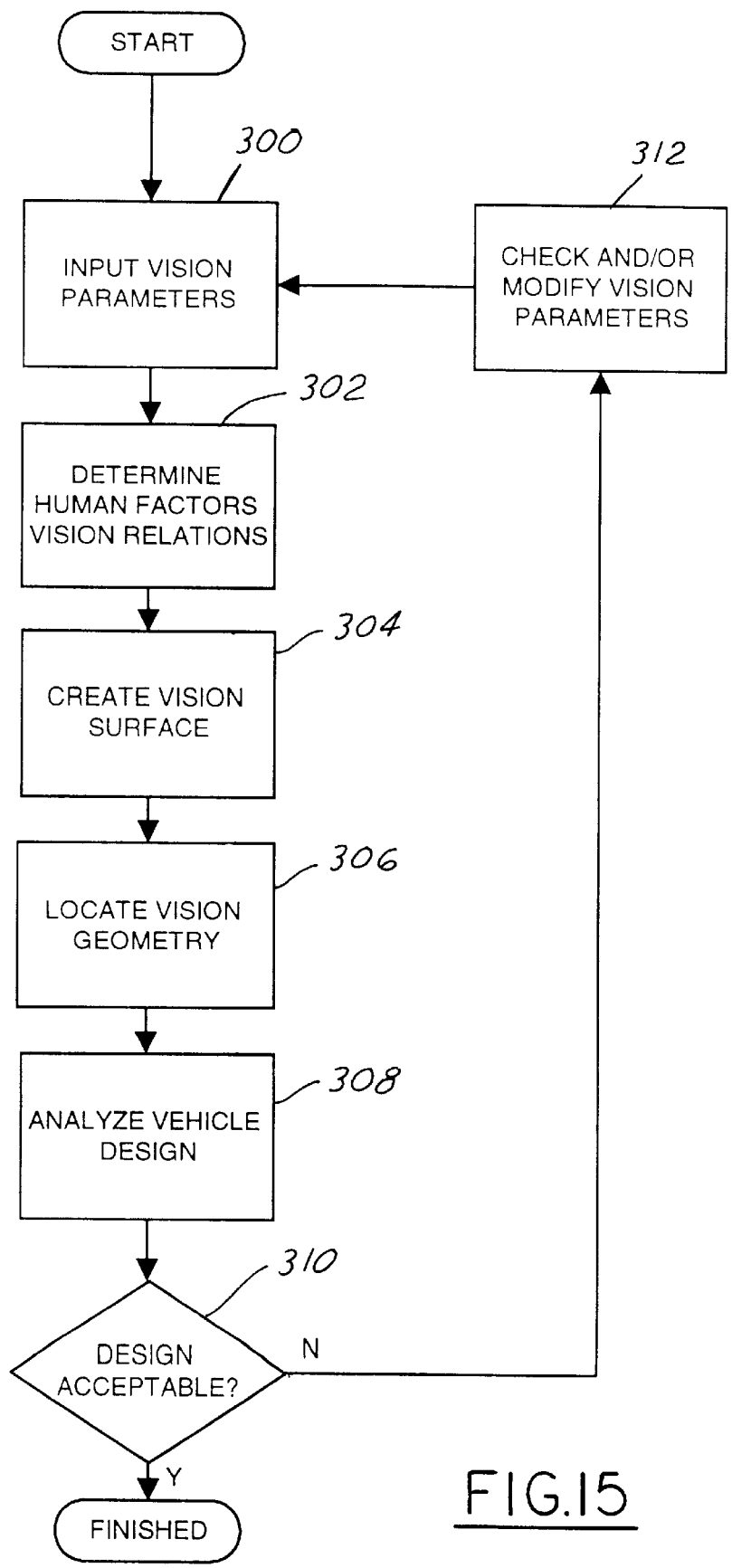
FIG. 15 is a flowchart showing a method for vehicle design using occupant vision surfaces according to the present invention.

A method for vehicle design using occupant vision surfaces according to the present invention is shown in FIG. 15. Beginning in box 300, various vision parameters are input into the system. Preferably, a set of default input vision parameters are available which can be modified by a vehicle designer to meet design specifications. These input vision parameters may include, for example, an occupant hip point (H point), a heel point, which may be located by a vertical distance (H30) from the H point and a horizontal distance (L53) from the H point, a foot angle on the accelerator (L47, angle Theta), the steering wheel outer diameter (W9), the steering wheel angle from the vertical (H18), a back angle (L40). steering wheel geometry, a center location for the steering wheel, a planview rotation angle for the steering wheel, an eyellipse center location, a graphics plane location and rotation angle, a instrument cluster mask draft angle and offset from trim cover, a trim cover opening width and planview radius, a maximum trim cover blockage offset, a horizontal distance from the heel point to the center of the steering wheel (L11), a distance from the heel point to the center of the steering wheel (H17), and an angle between the torso of an occupant and the upper leg of the occupant (L42). Those skilled in the art will recognize that some of the input vision parameters may be SAE parameters. Other input parameters may also be defined to further refine the occupant vision studies of the present invention.

Referring now to box 302 of FIG. 15, various human factors relations are determined after the input vision parameters have been identified. For example, the eyellipse may be determined by using the occupant hip point (H point), a vertical distance (H30) from the H point and a horizontal distance (L53) from the H point, a back angle (L40), a horizontal distance from the heel point to the center of the steering wheel (L11), a distance from the heel point to the center of the steering wheel (H17), and an angle between the torso of an occupant and the upper leg of the occupant (L42). The eyellipse is important for creating the rimblock and downlook surfaces (box 304, FIG. 15), which is further discussed below. In box 306, the vision surface geometry is output. That is, the vision surface geometry is electronically oriented within the vehicle. In box 308, the vehicle design is analyzed with respect to the vision surface. In the decision diamond 310, if the design is acceptable, then the process for the particular vision study is finished. However, if the design is not acceptable, then the flow branches from the decision diamond 310 to the box 312 in which the input vision parameters are checked to determine if they are satisfactory, and/or the input parameters are modified. The flow then returns to box 300 in which the modified parameters are input to the method and system of the present invention, and the process flow continues as just described.

Figure 16:
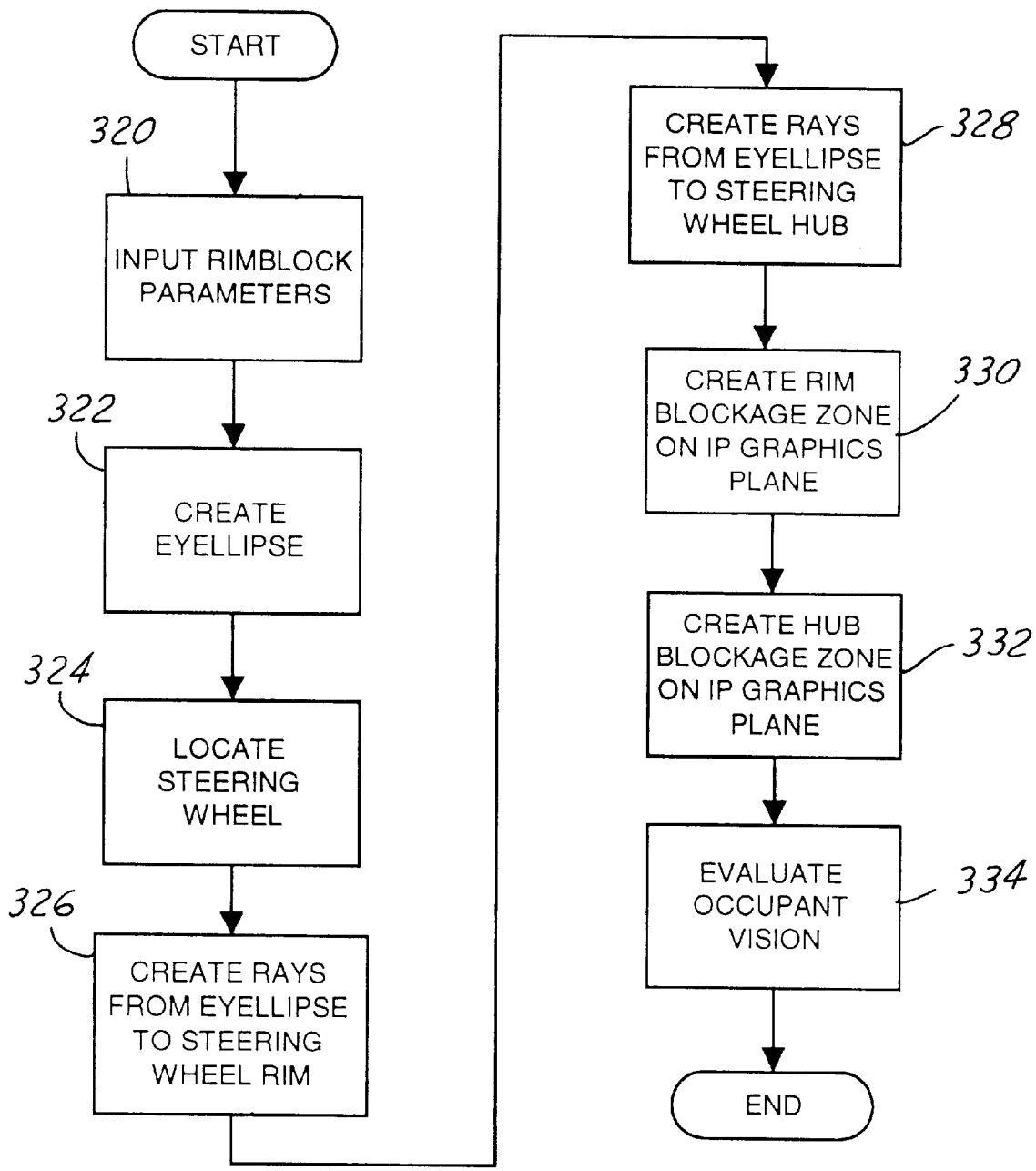
FIG. 16 is a flowchart showing creation and use of occupant vision rim and hub blockage surfaces for use in a human factors vision study according to an embodiment of the present invention.
Figure 19A:
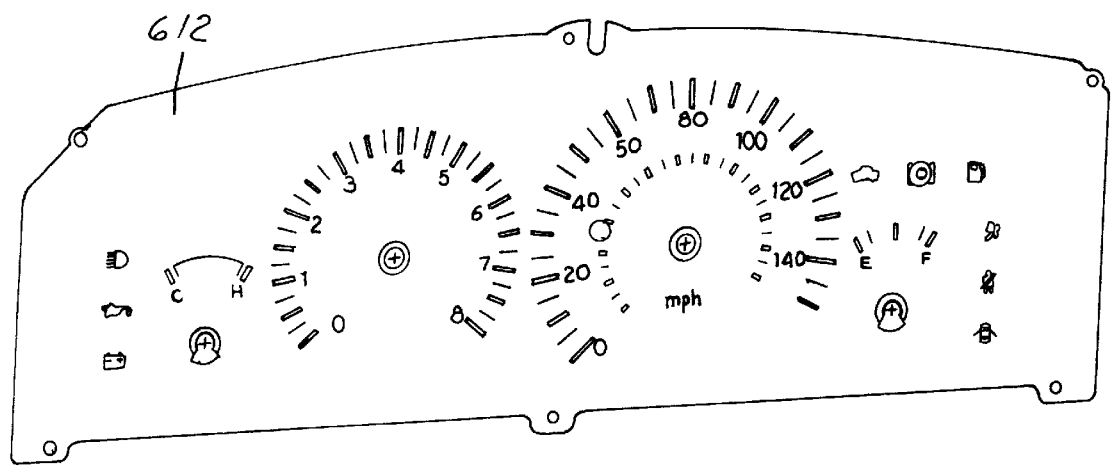
FIGS. 19A and 19B show front and side views, respectively, of an instrument panel cluster graphics plane.
Figure 19B:
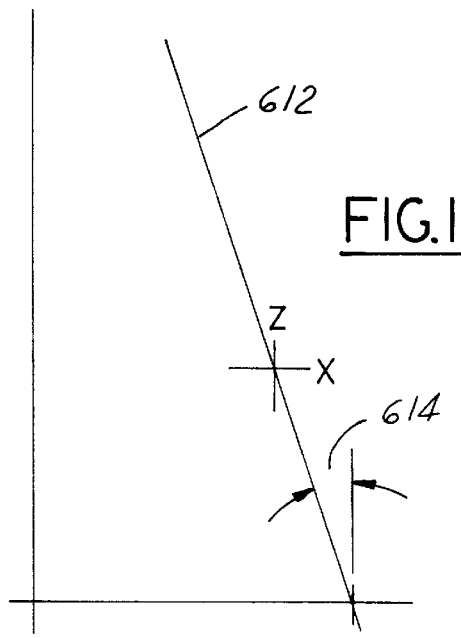
Figure 20:
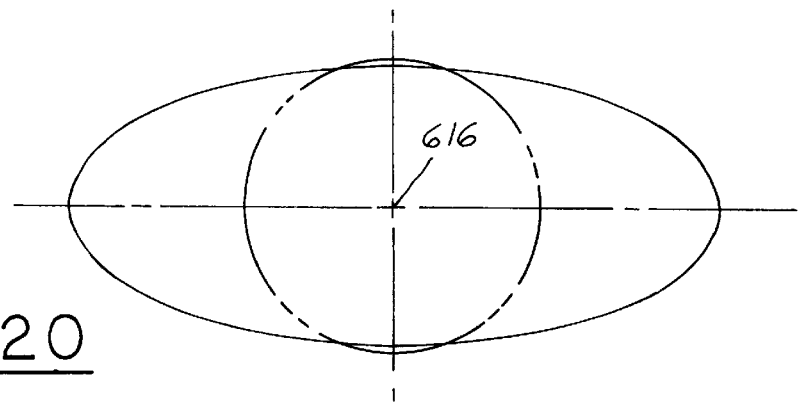
FIG. 20 shows orientation of an ellipse for use in creation of an eyellipse.

Turning now to FIG. 16, a flowchart showing one embodiment of a rim block study used as part of the present invention is shown. Beginning in box 320, rim block study parameters are input, for example, parameters specifying a steering wheel 600, including a steering wheel center location 602 (FIG. 17A), a steering wheel inner diameter 604 and outer diameter 606 (FIG. 17B), a steering wheel planview angle 608 and a sideview angle 610 (FIGS. 18A and 18B, respectively). An insturment panel cluster graphics plane 612 (FIG. 19A) is defined and oriented appropriately with a graphics plane rotation angle 614 (FIG. 19B). An eyellipse center 616 (FIG. 20) is defined and oriented as further described below. Input is preferably accomplished using prompts based on the designer's responses.

In box 322 of FIG. 16, an eyellipse is created in a geometric form. An eyellipse, for purposes of this disclosure, means a geometrical representation of eye location of a given population, for example 95% of vehicle drivers. The geometry takes the form of an ellipsoid and is further described in SAE J491. As with other geometry created by the method and system of the present invention, logic is employed for such creation and may be expressed as equations of numbers and variables geometric relationships, if-then loops, and other methods. In general, the logic is used to apply engineering and ergonomic knowledge, to reduce work required to perform similar operations, and to allow the geometry to change based on a designer's inputs.

Figure 22:
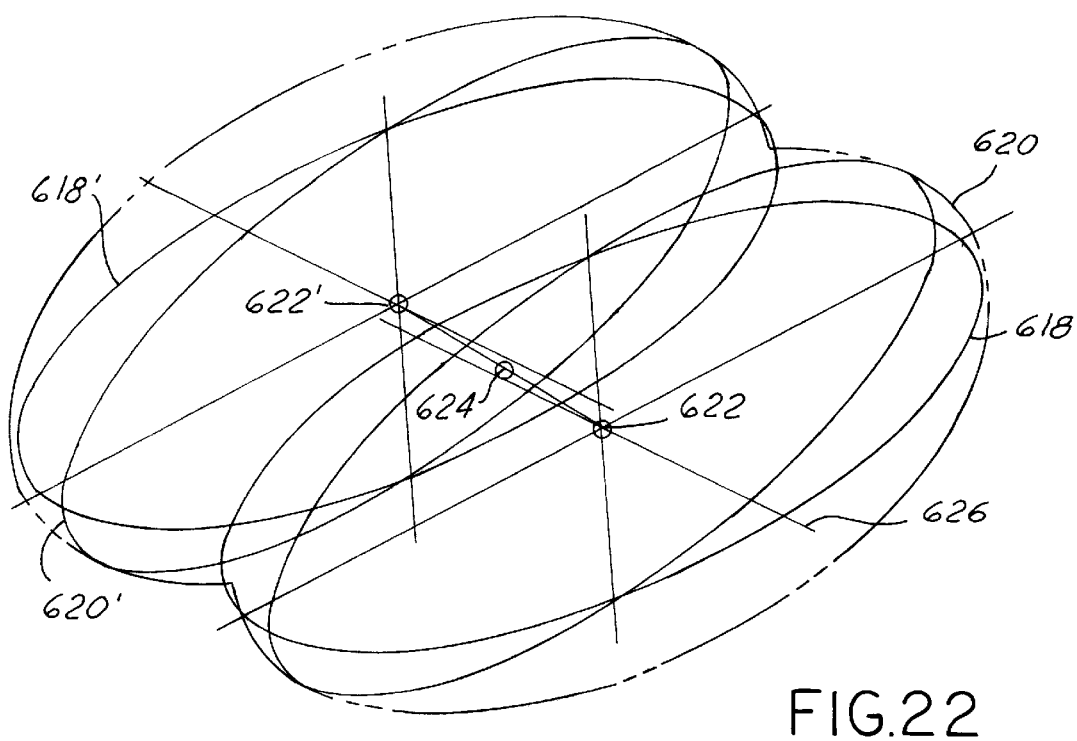
FIGS. 22A and 22B show plan and side perspective views of the pair of eyellipses of FIG. 21.
Figure 23A:
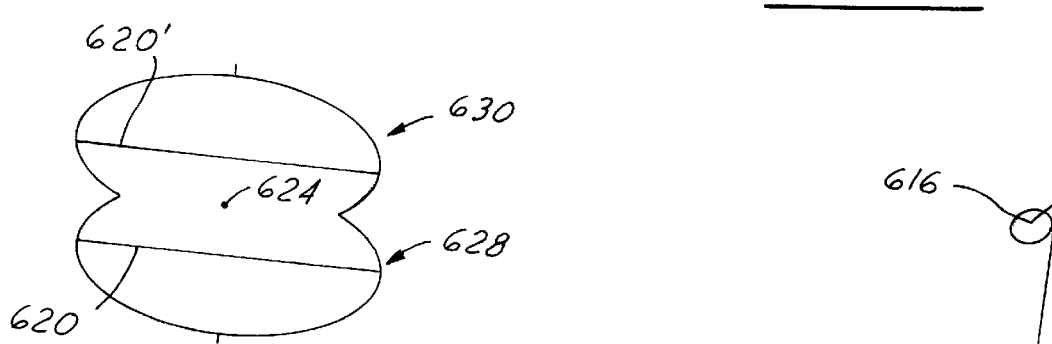
FIG. 23 is a perspective view showing orientation of a pair of eyellipses with respect to a vehicle coordinate system.
Figure 23B:
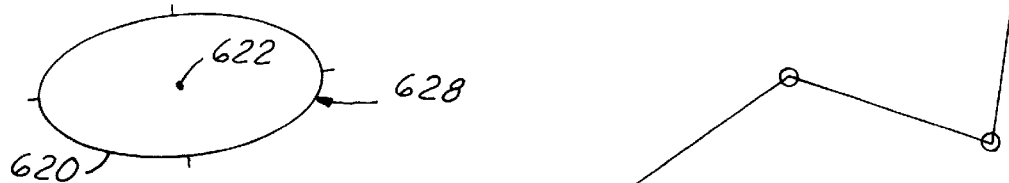
Figure 21:
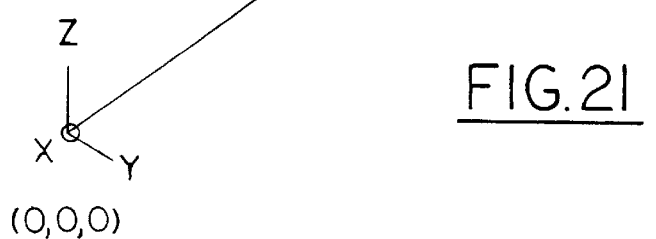
FIG. 21 is a perspective view of a pair of eyellipses representing probable eye locations of a given occupant population.
Figure 24:
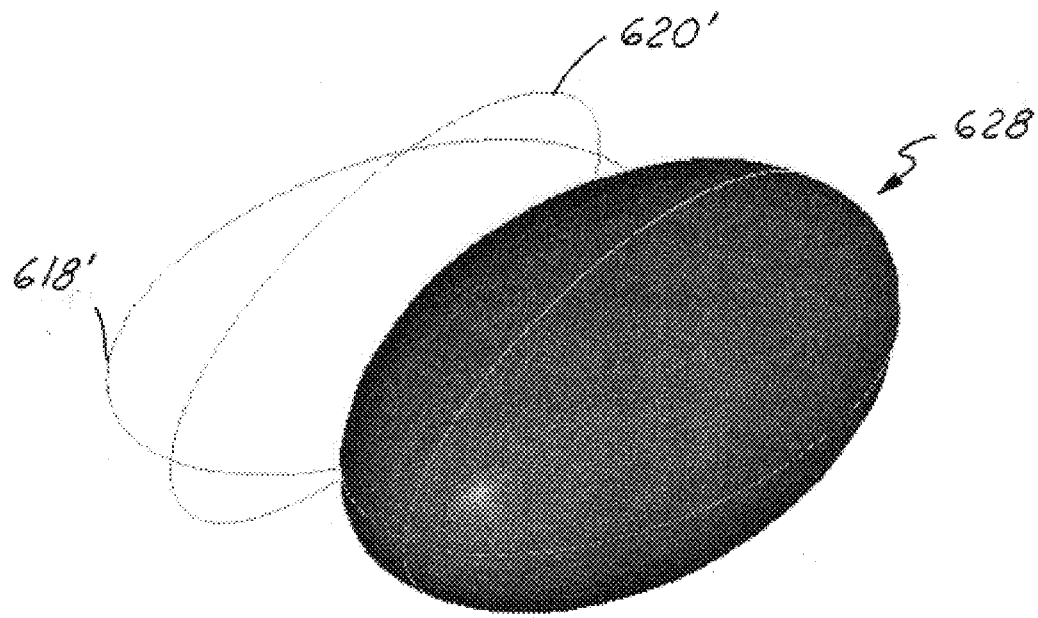
FIG. 24 is a perspective view of an eyellipse and a pair of orthogonal ellipses.
Figure 25:
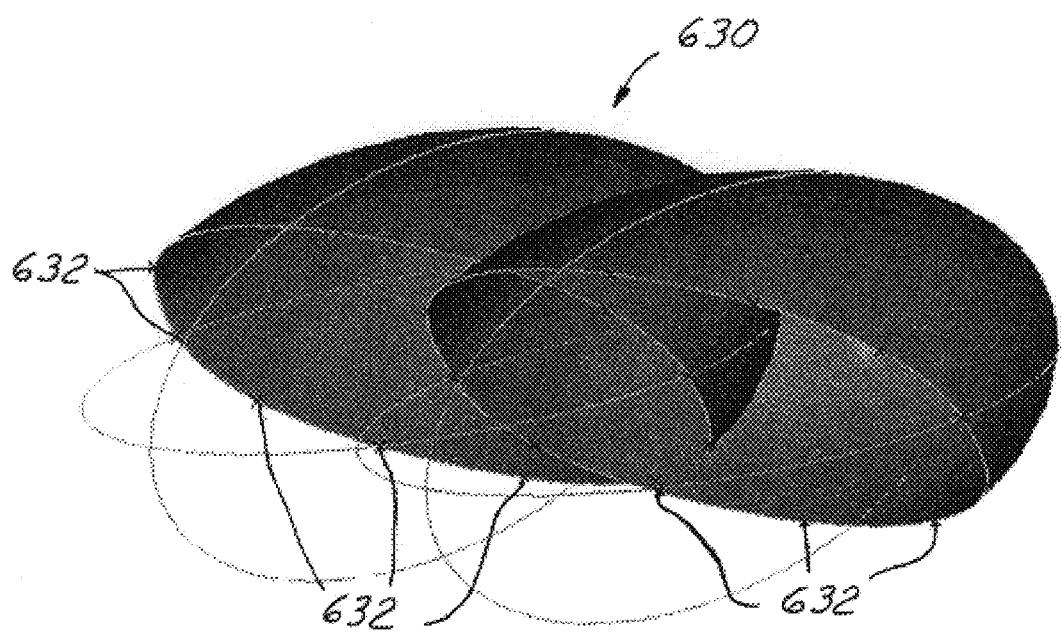
FIG. 25 is a perspective view showing a pair of eyellipses cut along a plane facing the instrument panel cluster.

Returning to the eyellipse creation of box 322, which is performed once for each eye of a vehicle driver, an eyellipse center 616 (FIG. 20) is located three-dimensionally with respect to a vehicle coordinate system, for example, in the X, Y, and Z directions (FIG. 21), for each eye. After the center has been located, an ellipse shape is created, preferably based on SAE guidelines (Motor Vehicle Drivers' Eye Locations-SAE J941), for both a planview ellipse 618 and a side view ellipse 620 (FIG. 22). It should be understood that a planview ellipse 618' and a side view ellipse 620' are created for the other eye as well (FIG. 22). Each eyellipse has a centroid 622, 622', respectively, and an eyellipse pair centroid 624 (FIG. 22) is defined a the midpoint between a line 626 connecting the eyellipse centroids 622, 622'. The ellipses 618, 620 and 618', 620' create frames (FIGS. 23A, 23B, 24) about which a surface is rendered to provide a three-dimensional representation of eyellipses 628, 630 for a left and right eye, respectively. It should be understood that the eyellipses 628, 630 intersect, as best seen in FIGS. 23A and 25. In FIG. 25 the eyellipses 628, 630 have been cut along a plane which faces the instrument panel cluster graphics plane, and a series of points 632 (marked as "x" in FIG. 25) have been identified for emanation of eye rays, as further discussed below.

After the eyellipses have been created, the steering wheel is located (box 324, FIG. 16). The steering wheel center is input by the user, and the shape and geometry of the steering wheel are also based on user inputs, as described above. The geometric representation of the steering wheel may be made by rotating a circular section 634 through 360° about the steering wheel center point 602 (FIG. 26).

Figure 26:
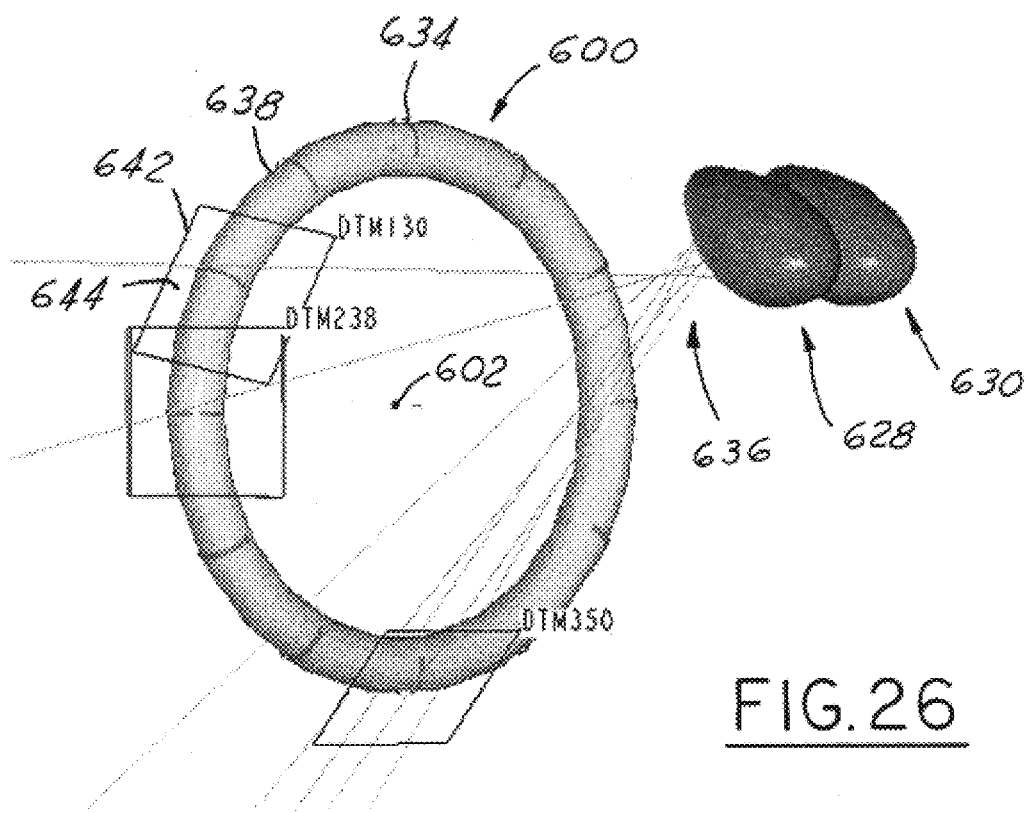
FIG. 26 is a perspective view showing rays emanating from the selected points on the cut eyellipses to selected points tangent to a steering wheel.

Continuing with the flowchart of FIG. 17 in box 326, a series of rays 636 from the eyellipse to the steering wheel are created (FIG. 26). To make the rays, tangencies are created to the eyellipses by cutting the eyellipse surfaces based on a sight line from the steering wheel center 602 to the centers of the eyellipses (FIGS. 25 and 26). Along the edge of each cut in the eyellipse surfaces are placed several spaced-apart points 632 (FIG. 25). Next, at several locations along the steering wheel, a cylinder 638 is made parallel to the steering wheel rim 640, a plane 642 is created tangent to the cylinder 638 relative to a point tangent to the eyellipse, and a point 644 is placed at the tangency of the plane and cylinder (FIG. 26). From each of the points tangent to the eyellipses, lines are created between each of the points tangent to the steering wheel extending past a graphics plane of the instrument cluster. Rays extending from the eyellipses 628, 630 past the steering wheel hub (not shown) are created in a similar manner (box 328, FIG. 16) as that just described for the steering wheel rim.

Figure 27:
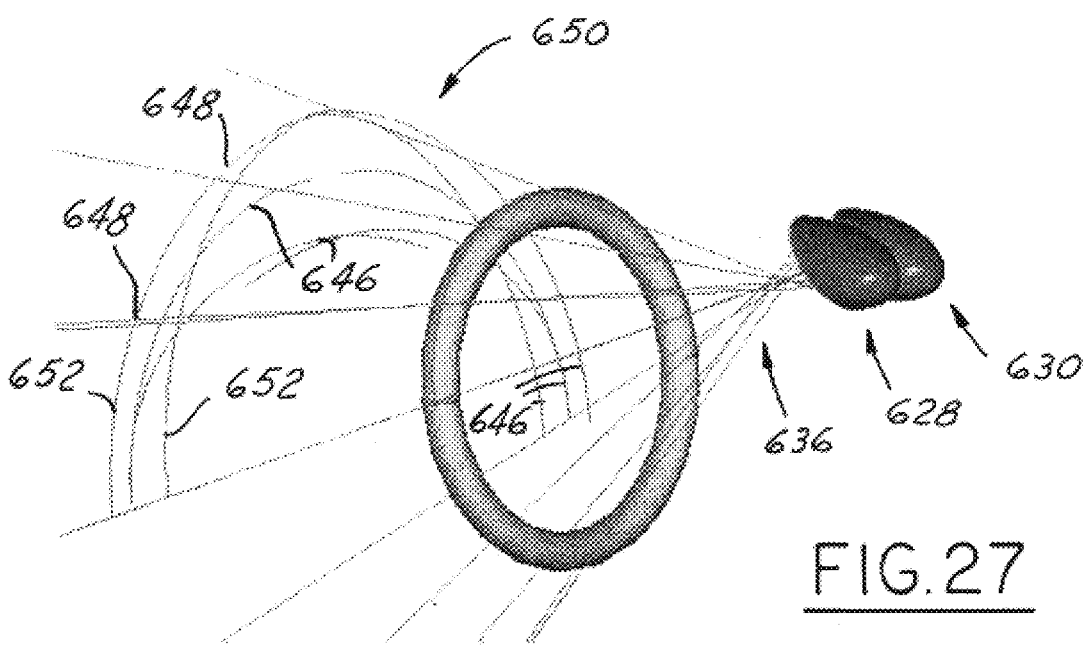
FIG. 27 is a perspective view similar to FIG. 26 and showing a rim blockage zone on a graphics plane.
Figure 28:
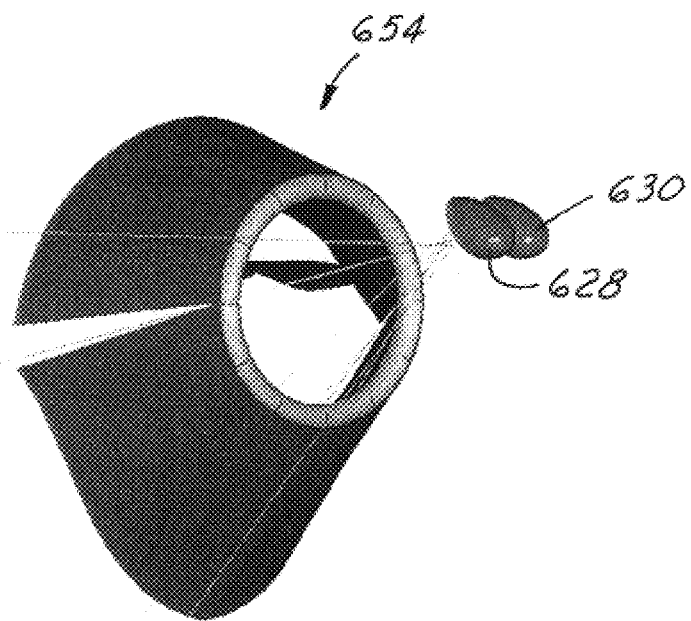
FIG. 28 is a perspective view similar to FIG. 27 but showing a rim blockage zone.

In box 330 of FIG. 16, rim blockage of the instrument panel graphics plane is created. Initially, lines 646 representing rim blockage are created by intersecting the rays 636 from the eyellipses 628, 630 with the instrument panel graphics plane to form points 648 on the graphics plane shown generally at 650 (FIG. 27). These points 648 are then connected together to form lines representing each eyellipse tangency point. Next, lines 652 forming the outer boundary of the zone created by the initial blockage are combined. Finally, surfaces 654 representing the rim block zone are created from tangencies on the steering wheel to the blockage lines 652 (FIG. 28).

A hub blockage zone is also created in box 332 (FIG. 16) using a similar method. A line is created representing the steering wheel hub tangent to the driver's line of sight (not shown). This can be done by setting a view along a driver's line-of-sight, then allowing the designer to modify surface shapes to represent the steering wheel hub. Next, rays from the eyellipse tangencies to the steering wheel tangencies are created. This is done by creating a surface from each bottom-most eyellipse point that extends to the hub tangency line. The surfaces are then extended beyond the graphics plane. Next, lines representing hub blockage are created by intersecting the rays surfaces with the graphics plane. Finally, lines representing the hub blockage are created by combining the lines forming the outer boundary of the zone created by the initial blockage.

The operations performed in boxes 320–332 are performed for each of the two eyellipse sizes representing the eye locations of a 95% male and the eye locations of a 5% female.

Figure 29:
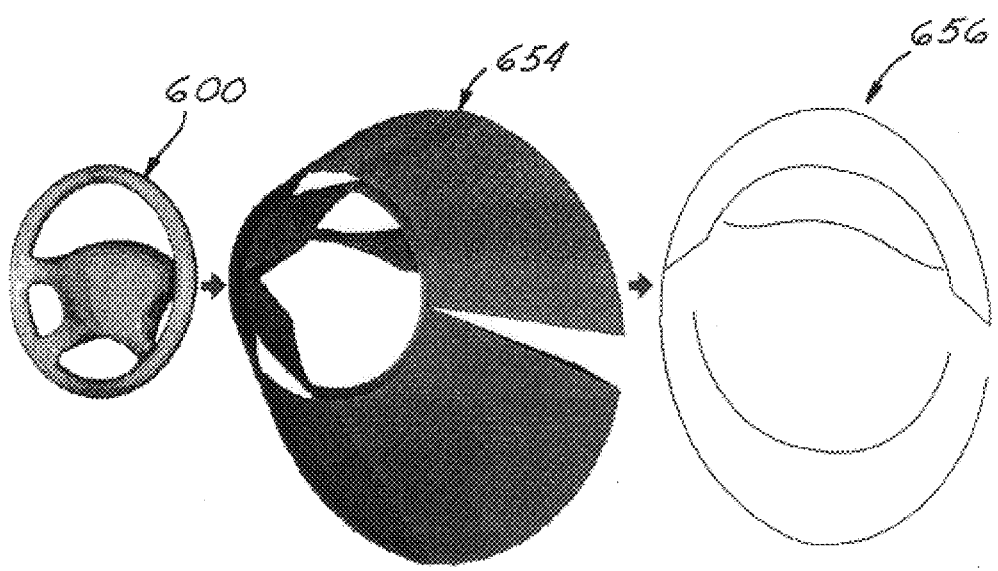
FIG. 29 is a perspective view showing creation of a steering wheel rim and hub blockage zone on an instrument panel graphics plane.
Figure 31:
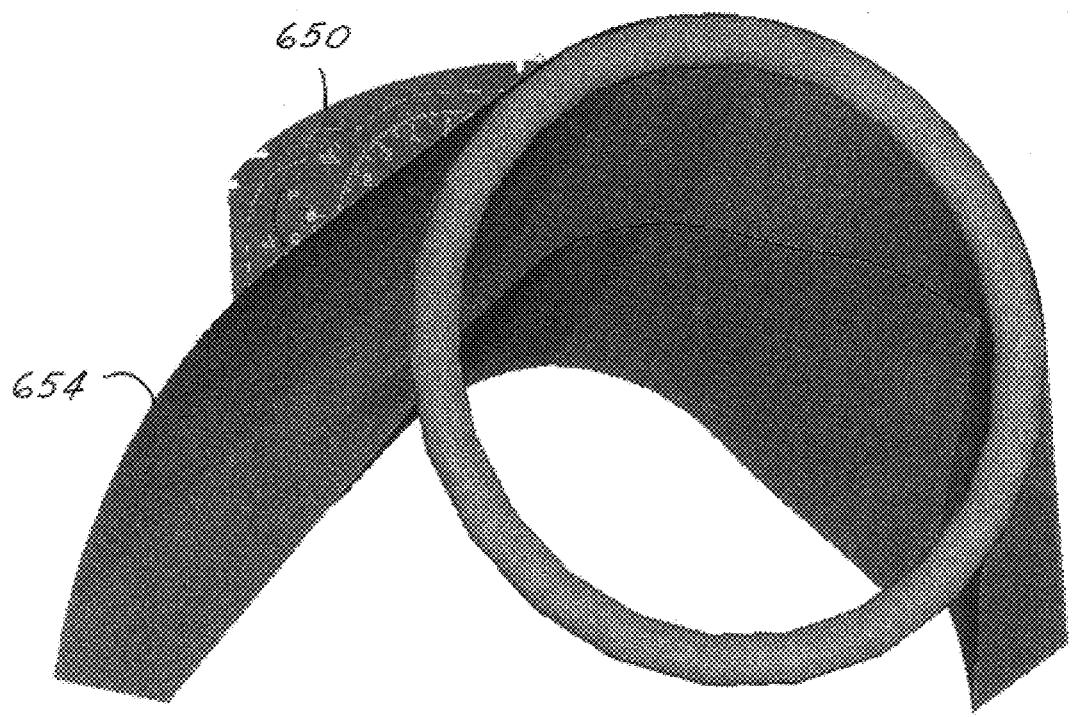
FIG. 31 is a perspective view of the rimblock zone which created the projection of FIG. 30.
Figure 33:
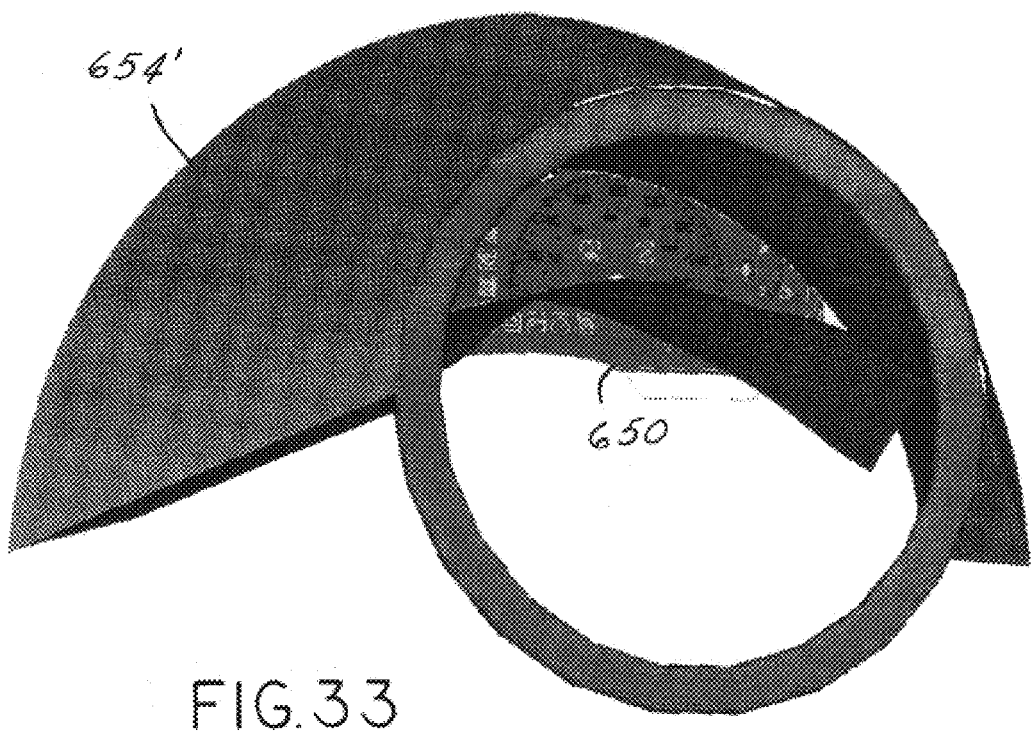
FIG. 33 is a perspective view of the rimblock zone which created the projection of FIG. 32.

When the rim and hub blockage surfaces 654 have been created, they are projected onto the instrument panel cluster graphics plane 650 to form a blockage zone 656 (FIG. 29). Occupant vision with respect to the steering wheel can thus be evaluated (box 334, FIG. 16). As seen in FIGS. 30 and 31, an initial design has a blockage zone 656 which excludes view of several important gauges on the instrument panel cluster, including the fuel gauge, temperature gauge, and also significant portions of the tachometer and the speedometer. By adjusting the occupant orientation vertically, and/or by repositioning the instrument panel cluster, the regenerated vehicle design yields rim and hub blockage surfaces 654' which, when projected onto the graphics plane 650, yield an instrument panel having gauges unobstructed by the steering wheel rim and hub blockage zone 656' (FIGS. 32 and 33).

Figure 34:
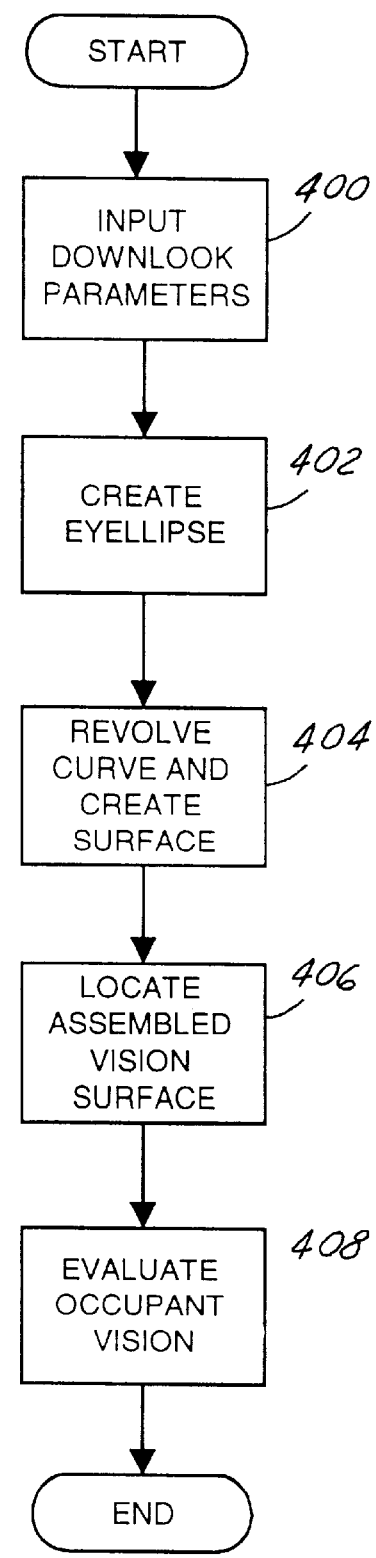
FIG. 34 is a flowchart showing creation and use of occupant vision downlook surfaces for use in a human factors vision study according to an embodiment of the present invention.
Figure 35:
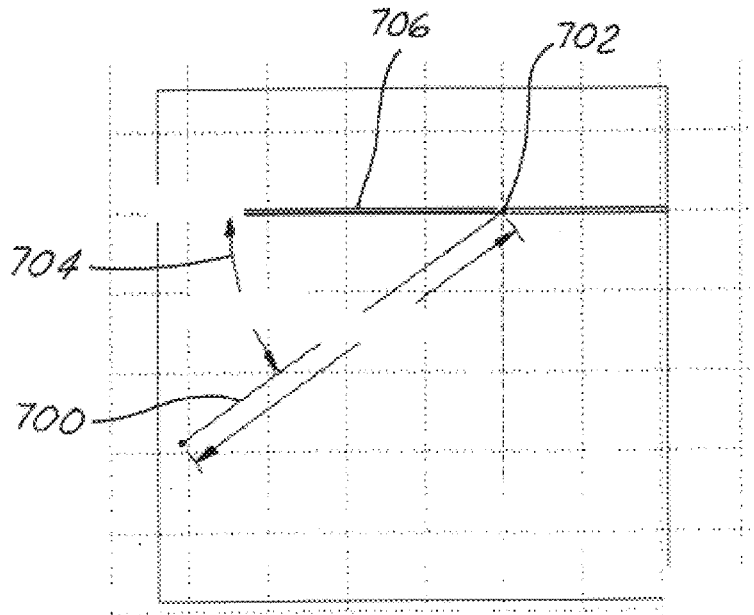
FIG. 35 shows creation of an eyellipse curve a desired angle for use with a downlook study according to the present invention.
Figures 36, 37:
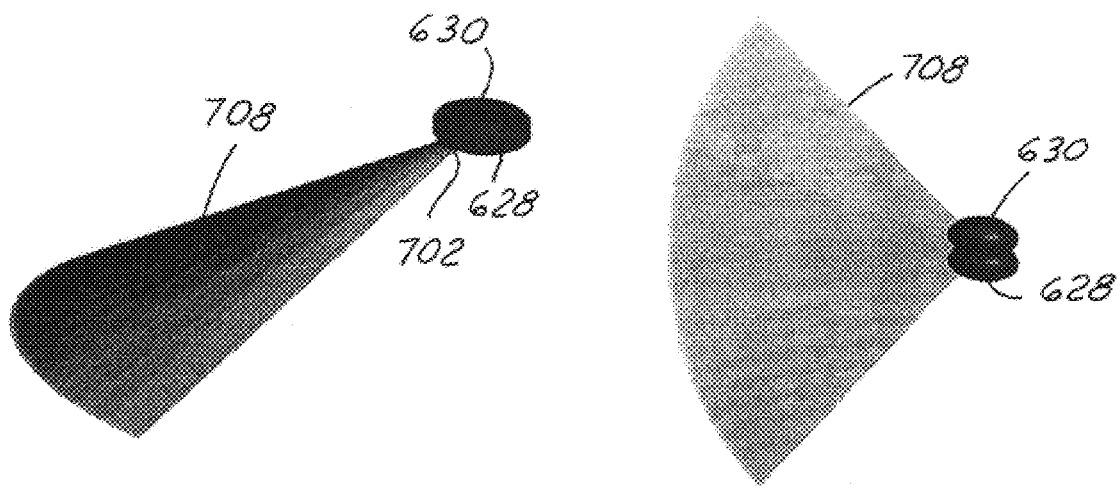
FIG. 36 is a side perspective view showing a downlook surface created with a pair of eyellipses.
FIG. 37 is a top view of FIG. 36.
Figure 38:
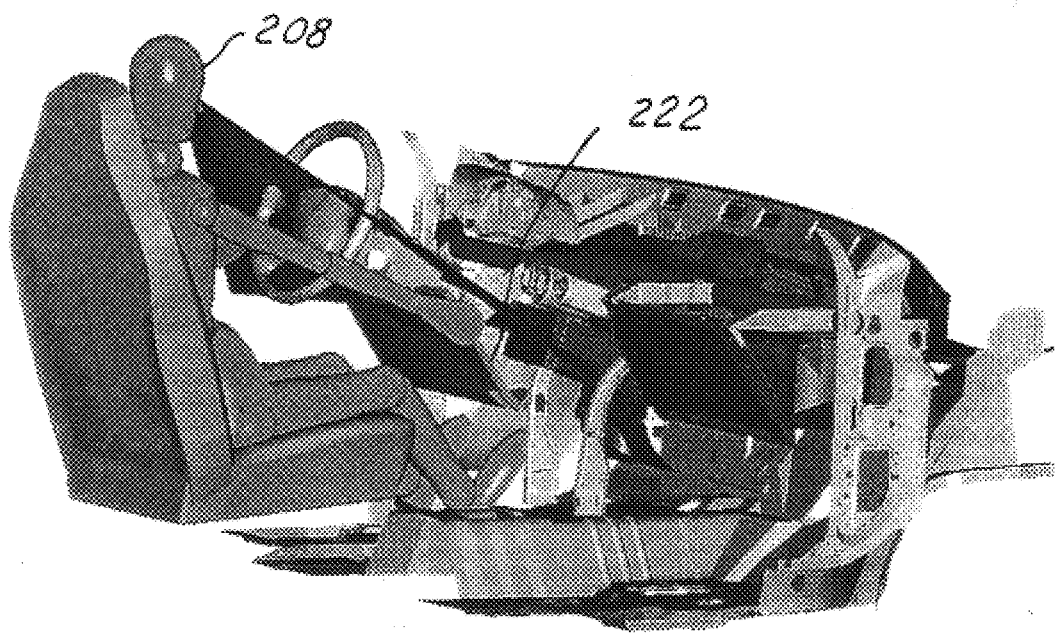
FIG. 38 is a color side perspective view of a downlook surface located within a vehicle showing a vehicle system below the surface.
Figure 39:
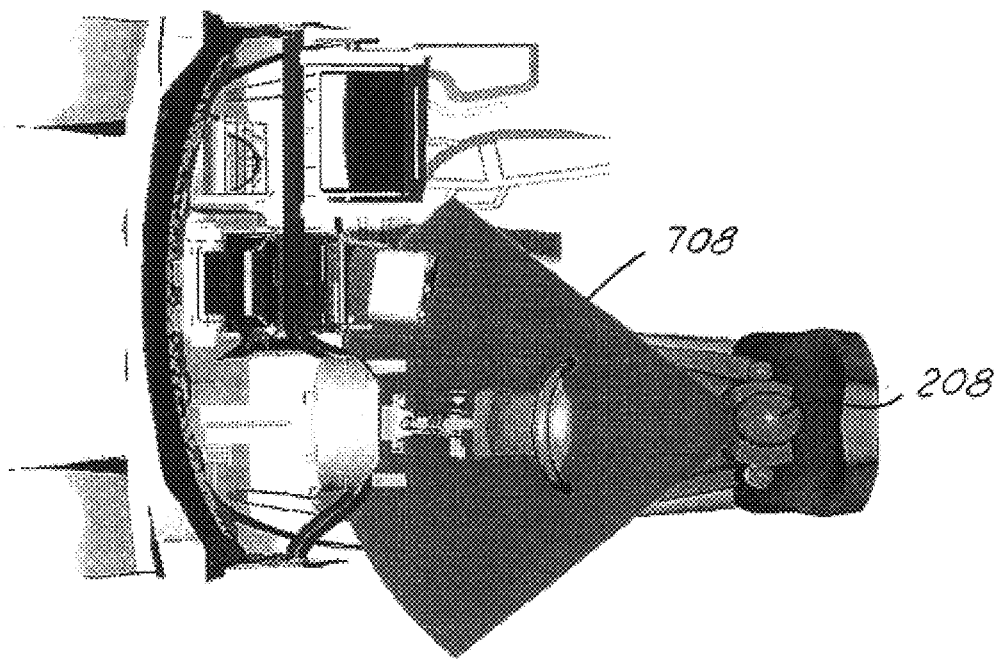
FIG. 39 is a color top view of FIG. 38.
Figure 40:
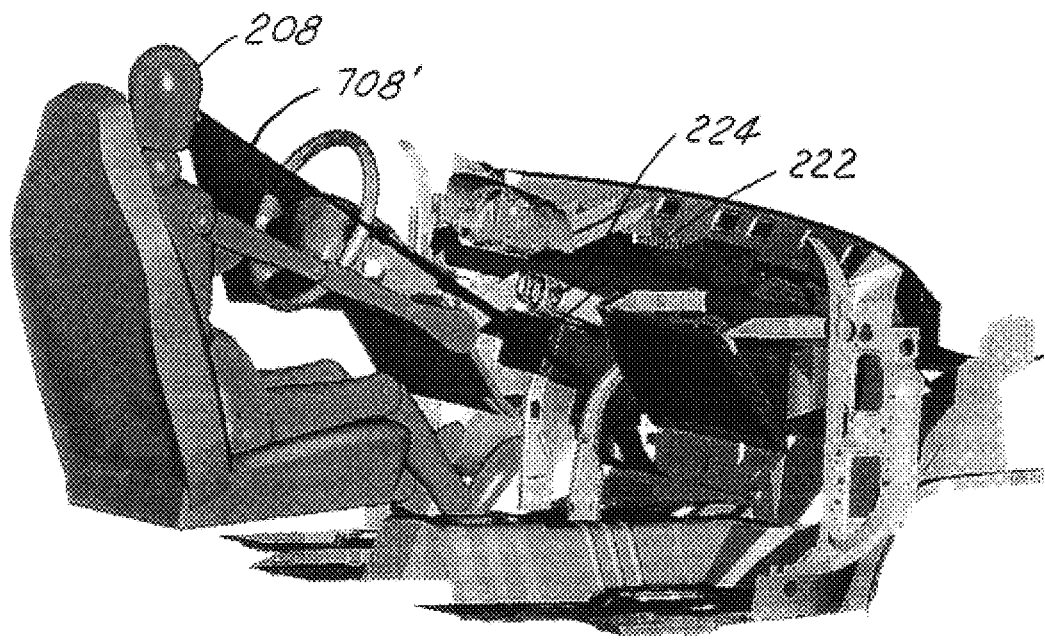
FIG. 40 is a color perspective view similar to FIG. 38 but showing a modified occupant orientation so that the occupant down look zone includes a significant portion of a vehicle system formerly below the downlook surface.
Figure 41:
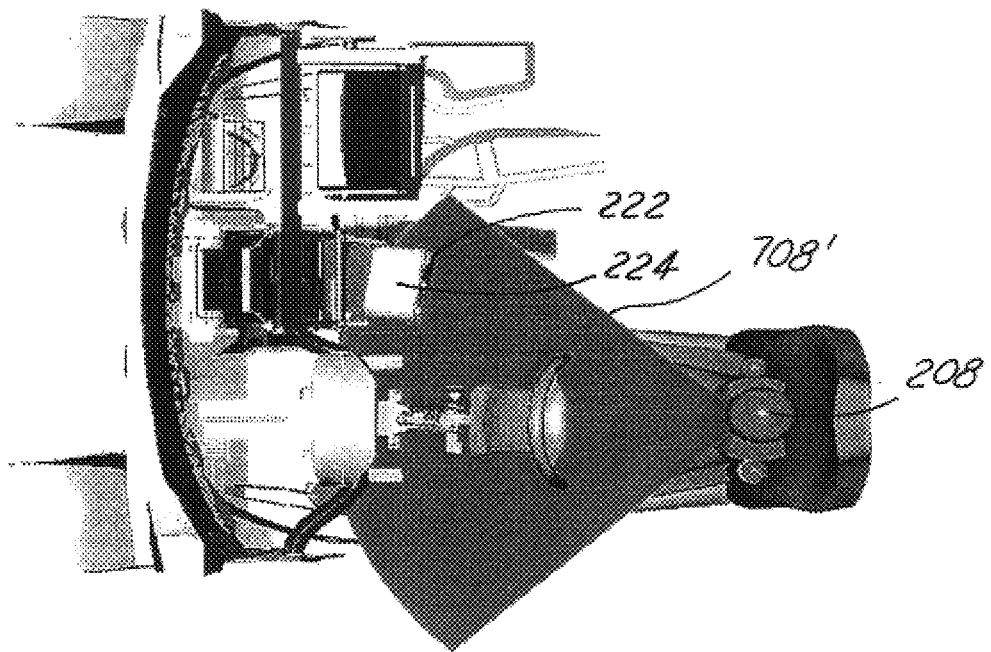
FIG. 41 is a color top view of FIG. 40.

Turning now to FIG. 34, a flowchart for a downlook human factors study according to the present invention is shown. Beginning in box 400, downlook parameters are input to the system of the present invention. The parameters may include, for example, a seating reference point (SgRP, an eyellipse centroid, and others). In box 402, an eyellipse is created as described above with reference to the rim and hub block studies. This includes creating a curve 700 from an eyellipse centroid 702 at a desired downlook angle 704 from a horizontal plane 706, as seen in FIG. 35. In box 404 (FIG. 34), the curve 700 can then be revolved 90° to create a downlook surface 708 (FIGS. 36–38). It should be understood that a downlook surface is created for each occupant eyellipse, and the downlook surfaces are superimposed to create a final downlook surface, which is then located within the vehicle (box 406, FIG. 34). The location of one such downlook surface is shown in FIGS. 38 and 39. As seen therein, a radio 222 is below the downlook surface 708, and thus not viewable by an occupant 208 without head movement. To improve the occupant's downlook, the components can be located higher or the driver could be repositioned, for example, in a vertical direction lower, so that part of the radio 222 is above the downlook surface 238 (blue) and thus viewable by the driver. Such repositioning is shown in FIGS. 40 and 41, wherein the driver position is lowered in a vertical direction such that the radio 222 and climate control system panel 224 are viewable without significant head movement (downlook surface 238). Such occupant vision evaluation is contemplated in box 408 of FIG. 34. It should be understood that repositioning of the occupant as just described can automatically regenerate all other effected vehicle dimensions and vehicle systems. For example, the location of the steering wheel and steering column may have to be adjusted to accommodate the lowered occupant position, thereby effecting the rim block and hub blockage studies. A method of the present invention will automatically regenerate a vehicle design as shown and described with reference to FIGS. 2, 5 and 15 above.

The method and system of the present invention may be used for a wide variety of occupant vision related tasks and is not limited to that shown in FIGS. 2–41. The present invention is meant to encompass a vehicle design method and system in a computer environment for allowing a vehicle designer to determine occupant vision interaction between computer electronic representations of the occupant and the vehicle, or systems on the vehicle, and to report the outcome of such a study to the vehicle designer.

Various human factor vision studies may be performed in addition to, or in place of, those described above. Studies which may be performed include optimum back angle, preferred steering wheel center, arm rest surface zone, torso angle, G-factor for use with vision zone generation, manual transmission stick shift hand clearance zone, optimum neutral shift location and variation plane, and hand recommended pattern and spacing curves for stick shift location for each gear position from the optimal neutral location.

As seen in the foregoing list, there are numerous human factor studies which may be conducted to provide a vehicle designer with information for enhancing vehicle ergonomics. The present invention is not, of course, limited to those studies described above as the list is meant to be illustrative and not limiting.

While the form of the invention shown and described herein constitutes a preferred embodiment of the invention, it is not intended to illustrate all possible forms thereof. The words used are of description rather than limitation, and various changes may be made without departing from the spirit and scope of the invention as disclosed.

We claim:

1. A computer aided method for designing a portion of an automotive vehicle, the method comprising the steps of:
   (a) storing in the memory of a computer system a first set of data representing an occupant position within the vehicle;
   (b) storing in the memory a second set of data representing a position for at least one vehicle system;
   (c) generating a third set of data representing a visual interaction between the first set of data and the second set of data; and
   (d) comparing the third set of data to a fourth set of data representing a predetermined occupant vision criteria.

2. A method for designing an automotive vehicle according to claim 1 wherein the first set of data includes data representing at least one of the following:
   occupant hip point data;
   data representing a distance between an accelerator heel point and the occupant hip point; and
   occupant back angle data.

3. A method for designing an automotive vehicle according to claim 1 wherein the second set of data includes data from an electronically stored parts library.

4. A method for designing an automotive vehicle according to claim 1 wherein the fourth set of data comprises human factors data.

5. A method for designing an automotive vehicle according to claim 4 wherein the human factors data comprises data from at least one of a set of occupant internal downlook data, a set of external forward and rearward downlook data, a set of rimblock data, a set of mask lens data, and a set of windshield vision data.

6. A method for designing an automotive vehicle according to claim 1 wherein the second set of data is varied in step (e) based upon a predefined set of rules.

7. A method according to claim 6 wherein the predefined rules comprise a set of locational relationships between the first and second sets of data.

8. A method for designing an automotive vehicle according to claim 1 including the step of generating a fifth set of data representing at least one occupant vision surface based upon the third set of data representing a visual interaction between the first set of data and the second set of data.

9. A method for designing an automotive vehicle according to claim 8 wherein the fifth set of data includes at least one of an occupant downlook surface, a forward and rearward downlook surface, a rimblock surface, a mask lens surface, and a windshield vision surfaces.

10. A method for designing an automotive vehicle according to claim 8 including the step of displaying the fifth set of data relative to the first and second sets of data.

11. A method for designing an automotive vehicle according to claim 8 wherein the fifth set of data is displayed so as to divide the passenger compartment into at least one of an occupant downlook zone, forward and rearward downlook zones, a rimblock zone, mask lens zones, and a windshield vision zone.

12. A method for designing an automotive vehicle according to claim I including the step of varying the second set of data until the third set of data meets the predetermined occupant vision criteria.

13. A computer aided method for designing a portion of an automotive vehicle, the method comprising the steps of:
    (a) storing in the memory of a computer system a first set of data representing an occupant position within the vehicle;
    (b) storing in the memory a second set of data representing a position for at least one vehicle system within the passenger compartment;
    (c) generating a third set of data representing a visual relationship between the first set of data and the second set of data;
    (d) comparing the third set of data to a fourth set of data stored in the memory representing a predetermined occupant vision criteria; and
    (e) varying the second set of data until the third set of data meets the predetermined occupant vision criteria.

14. A system for designing a portion of an automotive vehicle, the system comprising:
    (a) first code means for representing an occupant position within a passenger compartment in the vehicle;
    (b) second code means for representing a position for at least one vehicle system within the passenger compartment;
    (c) third code means for generating a visual relationship between the occupant position and the at least one vehicle system; and
    (d) fourth code means for comparing the visual relationship to a predetermined occupant vision criteria.

15. A system according to claim 14 including fifth code means for varying the position of the at least one vehicle system or the occupant position.

16. A system according to claim 14 wherein the first code means includes at least one of the following:
    code means for representing an occupant hip point;
    code means for representing a distance between an accelerator heel point and the occupant hip point; and
    code means for representing an occupant back angle.

17. A system according to claim 14 wherein the second code means includes code means for representing a parts library.

18. A system according to claim 14 wherein the predetermined occupant vision criteria comprises a set of human factors interaction data.

19. A system according to claim 18 wherein the human vision factors data comprises data from at least one of a set of a set of occupant downlook data, a set of forward and rearward downlook data, a set of rimblock data, a set of mask lens data, and a set of windshield vision data.

20. A system according to claim 15 wherein the fifth code means includes a set of locational rules between the first and second code means.

21. A system according to claim 15 including sixth code means for displaying the visual relationship between the occupant position and the at least one vehicle system.

22. A system according to claim 21 wherein the sixth code means causes the visual relationship between the occupant position and the at least one vehicle system to be displayed so as to divide the passenger compartment into at least one of an occupant downlook zone, forward and rearward downlook zones, a rimblock zone, mask lens zones, and a windshield vision zone.

23. A computer aided vehicle design system for designing a portion of an automotive vehicle, the system comprising:
    (a) parameter selection code means for selecting a value for at least one occupant position parameter;
    (b) occupant vision code means for determining a visual interaction between the at least one occupant position parameter and at least one vehicle device;
    (c) comparison code means for comparing the visual interaction to a predetermined criteria; and
    (d) adjustment code means for determining a locational change for the at least one vehicle device or the at least one occupant position parameter so that the visual interaction meets the predetermined criteria.

24. A system according to claim 23 wherein the adjustment code means includes code means for varying a device location of the at least one vehicle device with respect to the at least one occupant position parameter based upon a set of predefined rules.

25. A system according to claim 24 wherein the predefined rules are defined by locational code means comprising a set of locational relationships between each of the at least one vehicle devices.

26. A system according to claim 25 wherein the locational code means comprises a standard parts library electronicaly stored in a computer memory.

27. A system according to claim 23 wherein the predetermined criteria are embodied in a human factors code means.

28. A system according to claim 27 wherein the human factors code means includes at least one of a set of occupant downlook code means, a set of forward and rearward downlook code means, a set of rimblock code means, a set of mask lens code means, and a set of windshield vision code means.

29. A system according to claim 23 including display means for displaying a geometric representation of the visual interaction between the occupant representation and the at least one vehicle device.

30. A system according to claim 29 wherein the geometric representation is a surface which divides the passenger compartment into at least two zones.

31. A vehicle design system on a computer in which an occupant representation and at least one vehicle system have a common reference point, the system comprising:
    occupant representation means for orienting an occupant representation with respect to the common reference point in the computer;
    vehicle system representation means for representing in the computer at least one vehicle system with reference to the common reference point;
    interaction study means for performing at least one human factors interaction study between the occupant representation and the at least one vehicle system; and
    outcome communication means for reporting an outcome of the at least one human factors interaction study.

32. A vehicle design system on a computer having processor and a memory in which an occupant and at least one vehicle system are electronically represented with respect to a common reference point in a three-dimensional representation of a portion of a vehicle, the system comprising:
    occupant representation code means for orienting an occupant representation with respect to the common reference point in the computer;

vehicle system representation code means for representing the at least one vehicle system with reference to the common reference point;

vision interaction code means for causing the processor to perform at least one human factors vision interaction study between the occupant representation and the at least one vehicle system; and outcome communication code means for reporting an outcome of the at least one human factors vision interaction study.

33. A method for designing an automotive vehicle in a computer system in which a portion of a vehicle, an occupant representation, and at least one vehicle system are electronically represented, the method comprising the steps of:

(a) orienting the occupant representation within a passenger compartment in the vehicle;

(b) positioning the at least one vehicle system within the passenger compartment;

(c) generating at least one occupant vision surface based upon a predetermined occupant vision criteria; and (d) displaying said at least one occupant vision surface so as to divide the passenger compartment into at least two occupant vision zones.

34. A method for designing an automotive vehicle according to claim 33 wherein the occupant representation is oriented using a predefined set of occupant orientation parameters.

35. A method for designing an automotive vehicle according to claim 34 wherein the predefined set of occupant orientation parameters include at least one of the following:

an occupant hip point;

a distance between an accelerator heel point and the occupant hip point; and an occupant back angle.

36. A method for designing an automotive vehicle according to claim 33 wherein the at least one vehicle system is defined in an electronically stored parts library.

37. A method for designing an automotive vehicle according to claim 33 wherein the predetermined occupant vision criteria comprise a set of human vision factors.

38. A method for designing an automotive vehicle according to claim 37 wherein the set of human vision factors comprise at least one of a set of occupant internal downlook data, a set of external forward and rearward downlook data, a set of rimblock data, a set of mask lens data, and a set of windshield vision data.

39. A method for designing an automotive vehicle according to claim 33 wherein the at least one occupant vision surface comprises at least one of an occupant internal downlook surface, an external forward and rearward downlook surface, a rimblock surface, a mask lens surface, and a windshield vision surface.

40. A method for designing an automotive vehicle according to claim 33 wherein the at least one occupant vision zone comprises at least one of an occupant internal downlook zone, external forward and rearward downlook zones, a rimblock zone, mask lens zones, and a windshield vision zone.

41. A method for designing an automotive vehicle according to claim 33 and further including the step of repositioning the at least one vehicle system within the passenger compartment after step (d) based upon a predefined set of rules.

42. A method according to claim 41 wherein the predefined rules comprise a set of locational relationships between each of the at least one vehicle systems and adjacent vehicle systems and the portion of the vehicle electronically represented.

43. A computer aided method for designing a portion of an interior of an automotive vehicle in which an occupant position and at least one vehicle device are electronically represented, the method comprising the steps of:

(a) selecting a value for the at least one occupant position parameter;

(b) determining a visual relationship between the at least one occupant position parameter and the at least one vehicle device;

(c) comparing the visual relationship to a predetermined criteria; and (d) determining a locational change between the occupant position parameter and the at least one vehicle device so that the visual relationship meets the predetermined criteria.

44. A method for designing an automotive vehicle according to claim 43 wherein the occupant parameters at least one of the following:

an occupant hip point;

a distance between an accelerator heel point and the occupant hip point; and an occupant back angle.

45. A method for designing an automotive vehicle according to claim 43 wherein the at least one vehicle device is defined in an electronically stored parts library.

46. A method for designing an automotive vehicle according to claim 43 wherein the predetermined criteria comprise a set of human vision factors including at least one of a set of occupant internal downlook data, a set of external forward and rearward downlook data, a set of rimblock data, a set of mask lens data, and a set of windshield vision data.

47. A method for designing an automotive vehicle according to claim 43 and further including the step of repositioning the at least one vehicle device within the interior based upon the locational change.

48. A method for designing an automotive vehicle according to claim 47 wherein the locational change is partially determined by a set of locational relationships between each of the at least one vehicle device, adjacent vehicle devices, and the interior portion of the vehicle.

49. A computer aided method for designing, an interior portion of an automotive vehicle, the method comprising the steps of:

(a) selecting a set of generic parameters for describing an occupant position in the interior portion of the vehicle and occupant visual interaction with respect to at least one device within the vehicle;

(b) selecting a value for each of the set of generic parameters;

(c) generating a visual relationship between the occupant position and the at least one occupant device; and (d) determining a parameter change for at least one of the set of generic parameters so that the visual relationship meets a predetermined criteria.

50. A method for designing an automotive vehicle according to claim 49 and further including the steps of generating and displaying at least one occupant-to-vehicle vision surface based upon the visual relationship so as to divide the passenger compartment into a plurality of occupant vision zones.

51. A method for vehicle design on a computer having processor and a memory in which an occupant and at least one vehicle system are electronically represented with respect to a common reference point in a three-dimensional representation of a portion of a vehicle, the method comprising the steps of:

orienting an occupant representation with respect to the common reference point in the computer;

representing the at least one vehicle system with reference to the common reference point;

determining at least one occupant vision interaction between the occupant representation and the at least one vehicle system; and reporting the at least one occupant vision interaction.

52. A method according to claim 51 wherein the occupant vision interaction is determined based on a set of human factors vision criteria.

53. A method for designing an automotive vehicle according to claim 52 wherein the set of human factors vision criteria comprise at least one of an internal downlook criteria, an external forward and rearward downlook criteria, a rimblock criteria, a mask lens criteria, and a windshield vision criteria.

54. A method according to claim 51 wherein the occupant vision interaction is reported by displaying a geometric vision representation of the occupant interaction between the occupant representation and the at least one vehicle device.

55. A method according to claim 54 wherein the geometric vision representation is a surface which divides the passenger compartment into at least two vision zones.

56. A method according to claim 51 including the step of rendering a three-dimensional surface for the occupant vision representation, each of the at least one vehicle devices, and the portion of the vehicle.

57. A method according to claim 51 including the step of animating movement of the occupant vision representation, at least one vehicle device, and the portion of the vehicle.

58. A method according to claim 52 including the step of determining a locational change for the at least one vehicle device, the occupant representation, or both, so that the occupant vision interaction meets the predetermined vision criteria.

59. A method according to claim 58 including the step of varying a device location of the at least one vehicle device with respect to the common reference point so that the occupant vision interaction meets the predetermined vision criteria.

60. A method according to claim 52 including the step of varying a device representation of the at least one vehicle device so that the occupant vision interaction meets the predetermined vision criteria.

61. A method according to claim 60 wherein the device representation is selected from an electronically stored standard parts library.

62. A method according to claim 58 including the step of regenerating a vehicle design after making the locational change by changing at least one effected dimension of one of the at least one vehicle systems and the portion of the vehicle as required by the locational change.

63. A method according to claim 62 including the step of automatically selecting parts from an electronic parts library as a substitute for at least one vehicle system to meet a vehicle system change required by the locational change.

* * * * *